(12) United States Patent
Liu et al.

(10) Patent No.: US 12,477,730 B2
(45) Date of Patent: Nov. 18, 2025

(54) ELECTRONIC DEVICES COMPRISING SEGMENTED HIGH-K DIELECTRIC MATERIALS AND STORAGE NODE MATERIALS, RELATED SYSTEMS, AND METHODS OF FORMING

(71) Applicant: Micron Technology, Inc., Boise, ID (US)

(72) Inventors: Yifen Liu, Meridian, ID (US); Xin Lan, Singapore (SG); Byeung Chul Kim, Boise, ID (US); Ye Xiang Hong, Singapore (SG); Yun Huang, Singapore (SG); Sok Han Wong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 485 days.

(21) Appl. No.: 17/804,752

(22) Filed: May 31, 2022

(65) Prior Publication Data
US 2023/0389311 A1    Nov. 30, 2023

(51) Int. Cl.
*H01L 27/11578* (2017.01)
*H10B 43/10* (2023.01)
*H10B 43/20* (2023.01)
*H10D 62/10* (2025.01)

(52) U.S. Cl.
CPC .............. *H10B 43/20* (2023.02); *H10B 43/10* (2023.02); *H10D 62/115* (2025.01)

(58) Field of Classification Search
CPC ........ H10B 43/20; H10B 43/10; H10B 43/27; H01L 29/0649; H01L 29/40117; H10D 62/115; H10D 64/037
See application file for complete search history.

(56) References Cited

U.S. PATENT DOCUMENTS

| | | | |
|---|---|---|---|
| 11,037,956 | B2 | 6/2021 | Kim et al. |
| 2020/0373322 | A1 | 11/2020 | Surthi et al. |
| 2020/0388627 | A1 * | 12/2020 | Hopkins ................ H10B 43/27 |
| 2020/0402994 | A1 * | 12/2020 | Yang ..................... H10B 43/35 |
| 2021/0057434 | A1 | 2/2021 | Surthi et al. |
| 2021/0057436 | A1 | 2/2021 | Kim et al. |
| 2021/0143171 | A1 | 5/2021 | Kim et al. |
| 2021/0327898 | A1 | 10/2021 | Kim et al. |

FOREIGN PATENT DOCUMENTS

WO    WO-2021034432 A1 *    2/2021    ......... H01L 21/0214

* cited by examiner

*Primary Examiner* — Ermias T Woldegeorgis
(74) *Attorney, Agent, or Firm* — TraskBritt

(57) ABSTRACT

An electronic device includes a stack structure including vertically alternating dielectric materials and conductive materials, the conductive materials including first regions and second regions, and pillars extending vertically through the stack structure, the pillars adjacent to the second regions of the conductive materials. The pillars include cell films adjacent to the second regions, the cell films including a high-k dielectric material, a barrier oxide material, a storage node material, a tunneling material, and a channel material. Segments of each of the high-k dielectric material, the barrier oxide material, and the storage node material are adjacent to the second regions. A length of the segments of high-k dielectric material and a length of the segments of storage node material adjacent to the second regions are greater than a height of the first regions of the conductive materials. Related methods and systems are also disclosed.

18 Claims, 11 Drawing Sheets

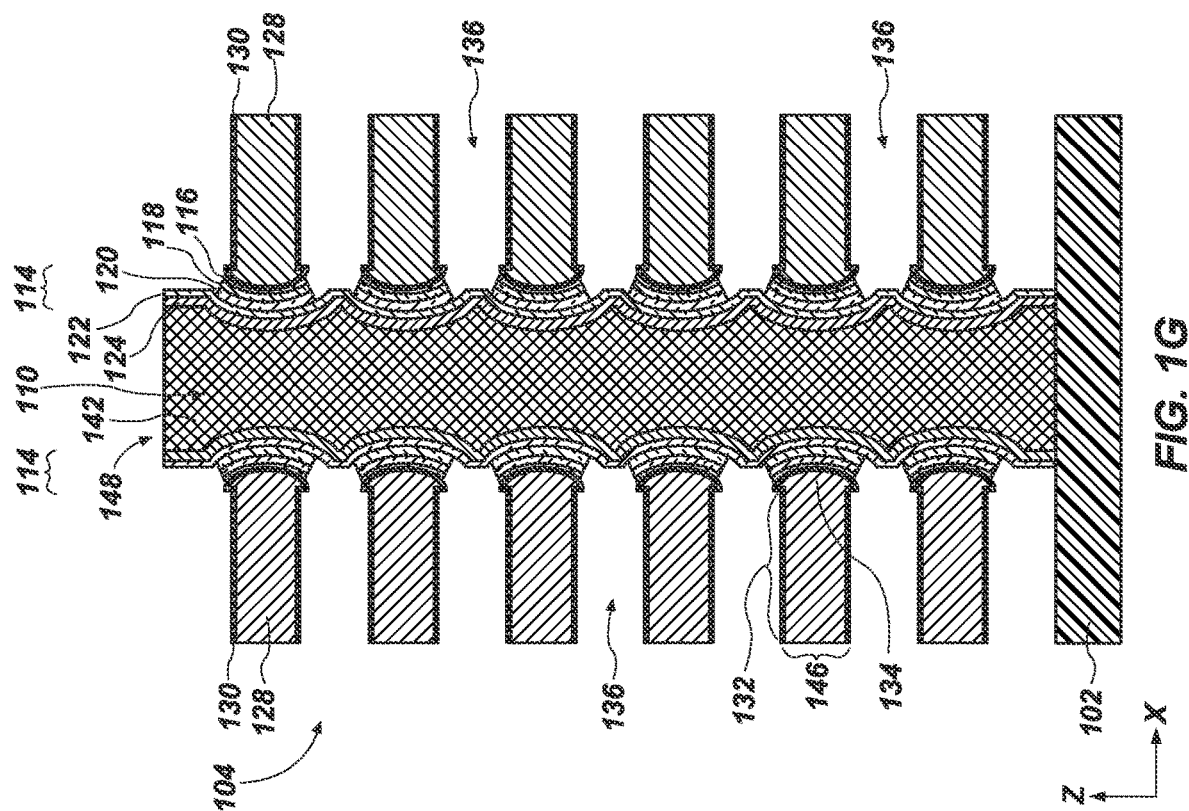

ELECTRONIC DEVICES COMPRISING SEGMENTED HIGH-K DIELECTRIC MATERIALS AND STORAGE NODE MATERIALS, RELATED SYSTEMS, AND METHODS OF FORMING

TECHNICAL FIELD

The disclosure, in various embodiments, relates generally to the field of electronic devices and electronic device fabrication. More particularly, the disclosure relates to electronic devices comprising conductive materials of tiers including an enlarged region and storage node material segments having an increased length, and to related methods and systems.

BACKGROUND

A continuing goal of the electronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures.

Conventional 3D NAND Flash memory devices include a vertical memory array with vertical memory strings including memory cells extending through openings in one or more stack structures including conductive materials and dielectric materials. The memory cells operate by movement of charge between a channel material and a storage node material (i.e., a storage nitride material, a charge storage material). Programming of a memory cell may include moving the charge (e.g., electrons) from the channel material into the storage node material and storing the charge within the storage node material. Erasing a memory cell may include moving holes into the storage node material to recombine with the electrons stored in the storage node material, releasing charge from the storage node material. Conventional memory cells often include a continuous storage node material which extends across multiple memory cells of the memory array. The continuous storage node material may lead to charge migration from one memory cell to another, resulting in cell to cell interference and data retention problems. However, a discontinuous storage node material may result in an active cell area of the memory cells which is too narrow to achieve desired program/erase windows.

BRIEF DESCRIPTION OF THE DRAWINGS

FIGS. 1A through 1H are cross-sectional views at various stages of forming an electronic device according to embodiments of the disclosure;

DETAILED DESCRIPTION

Figure 1B:
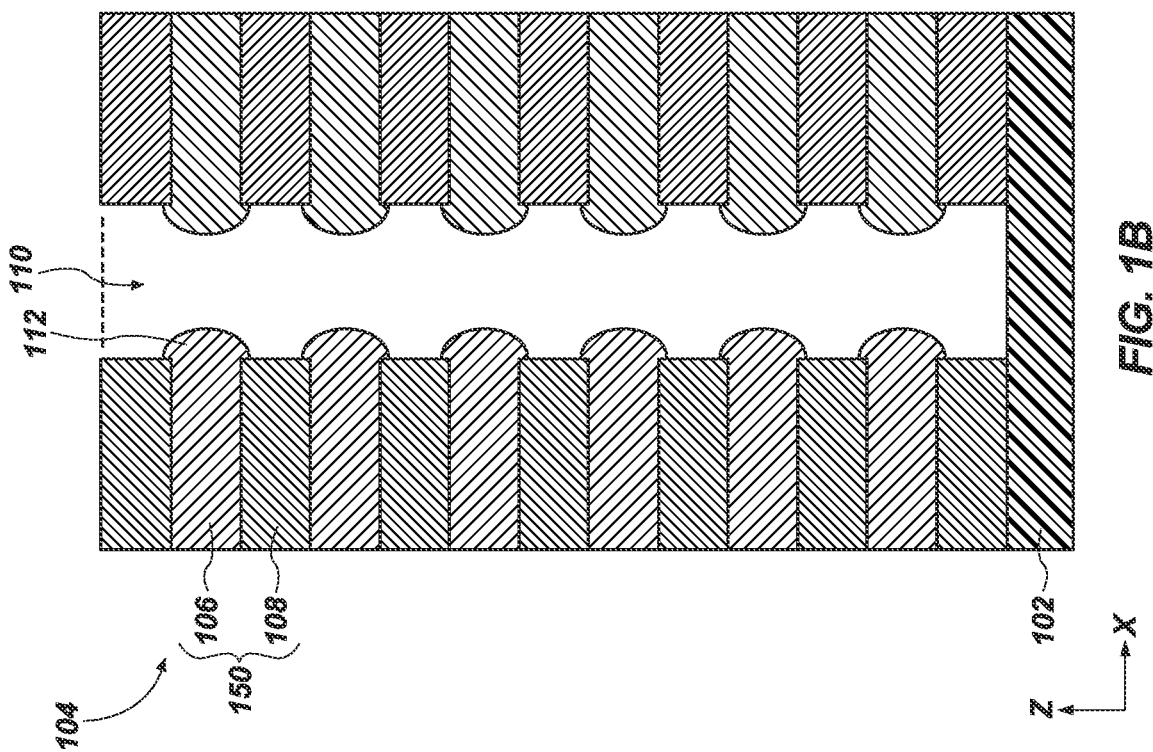

An electronic device (e.g., an apparatus, a semiconductor device, a memory device) that includes an increased storage node material length is disclosed. A pillar extends vertically through a stack structure of tiers of vertically alternating dielectric and conductive materials within a pillar opening. The conductive materials include a first region proximal to the pillar and a second region distal to the pillar. The pillar includes cell films including a high-k dielectric material, a barrier oxide material, a storage node material, a tunneling material (e.g., an electron and hole tunneling material), and a channel material. The high-k dielectric material, barrier oxide material, and storage node material each include segments of material disposed adjacent to the first region of the conductive materials. A length extending in a vertical direction (e.g., the Z-direction) of the segments of the high-k dielectric material and a length extending in the vertical direction of the segments of the storage node material are each greater than a height of the second region of the conductive materials. The tunneling material continuously extends over the storage node material and sidewalls of the dielectric materials along the pillar opening. The channel material continuously extends over the tunneling material along the pillar opening. Individual conductive materials of the stack structure and portions of the cell films laterally adjacent to the individual conductive materials may form individual memory cells.

The segments of the high-k dielectric material and the segments of the storage node material may be present at different lengths, with the lengths being greater than the height of the second region of the conductive materials. The segments of the high-k dielectric material and the storage node material may advantageously impede charge migration and interference between memory cells, providing improved data retention of the electronic device. Additionally, the increased length of the storage node material may result in a larger active cell area of the memory cells, and may enable desired wide program/erase windows associated with the memory cells. The smaller height of the first region of the conductive materials may facilitate stacking more memory cells within a given height of the stack structure (e.g., increasing memory density).

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below.

Additional acts to form a complete electronic device may be performed using conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shaped depicted in the drawings as a result, for example, of manufacturing techniques and/or tolerances are to be expected. Thus, embodiments described herein are not to be construed as being limited to the particular shapes or regions as illustrated, but include deviations in shapes that results, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "configured" refers to a size, shape, material composition, and arrangement of one or more of at least one structure and at least one apparatus facilitating operation of one or more of the structure and the apparatus in a pre-determined way.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "high-k dielectric material" means and includes a dielectric oxide material having a dielectric constant greater than the dielectric constant of silicon oxide (SiOx), such as silicon dioxide ($SiO_2$). The high-k dielectric material may include, but is not limited to, a high-k oxide material, a high-k metal oxide material, or a combination thereof. By way of example only, the high-k dielectric material may be aluminum oxide, gadolinium oxide, hafnium oxide, niobium oxide, tantalum oxide, titanium oxide, zirconium oxide, hafnium silicate, a combination thereof, or a combination of one or more of the listed high-k dielectric materials with silicon oxide.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "sacrificial," when used in reference to a material or a structure, means and includes a material, structure, or a portion of a material or structure that is formed during a fabrication process but which is removed (e.g., substantially removed) prior to completion of the fabrication process.

As used herein, the term "stack" or "stacks" means and includes a feature having one or more materials vertically adjacent to one another, the stacks may include alternating dielectric materials and conductive materials, such as alternating oxide materials and metal materials or alternative oxide materials and polysilicon materials. Depending on the stage of fabrication of the electronic device containing the stacks, the stacks may alternatively include alternating dielectric materials and nitride materials, such as alternating oxide materials and silicon nitride materials.

As used herein, "conductive material" means and includes an electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, a Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and conductively-doped semiconductor material (e.g., conductively-doped polysilicon, conductively-doped germanium (Ge), conductively-doped silicon germanium (SiGe)).

As used herein, "dielectric material" means and includes an electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), and a magnesium oxide ($MgO_x$)), at least one dielectric nitride material (e.g., a silicon nitride ($SiN_y$)), at least one dielectric oxynitride material (e.g., silicon oxynitride ($SiO_xN_y$)), and at least one dielectric carboxynitride material (e.g., a silicon carboxynitride ($SiO_xC_zN_y$)). Formulae including one or more of "x," "y," and "z" herein represent a material that contains an average ratio of "x" atoms of one element, "y" atoms of another element, and "z" atoms of an additional element (if any) for every atom of another element. Values of "x," "y," and "z" (if any) may be positive real integers or positive real non-integers.

As used herein, the term "substantially" in reference to a given parameter, property, or condition means and includes to a degree that one of ordinary skill in the art would understand that the given parameter, property, or condition is met with a degree of variance, such as acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be an electronic substrate, a semiconductor substrate, a base semiconductor layer on a supporting structure, an electrode, an electronic substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 1A:
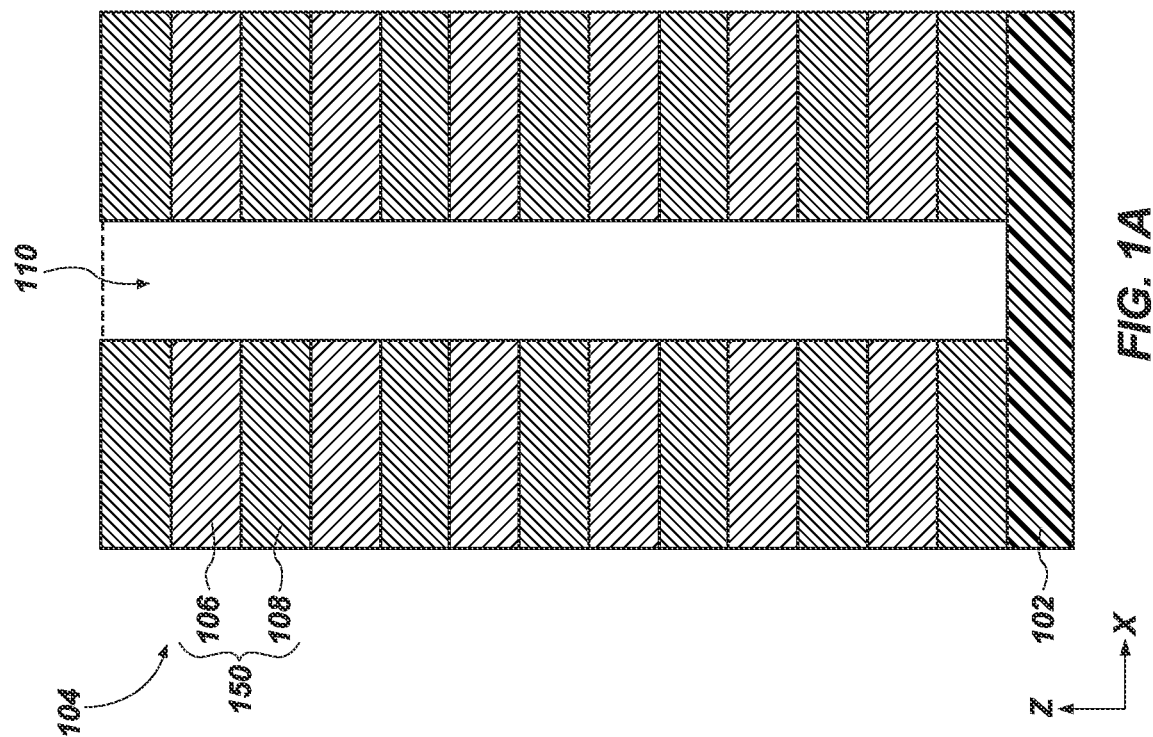
Figure 1D:
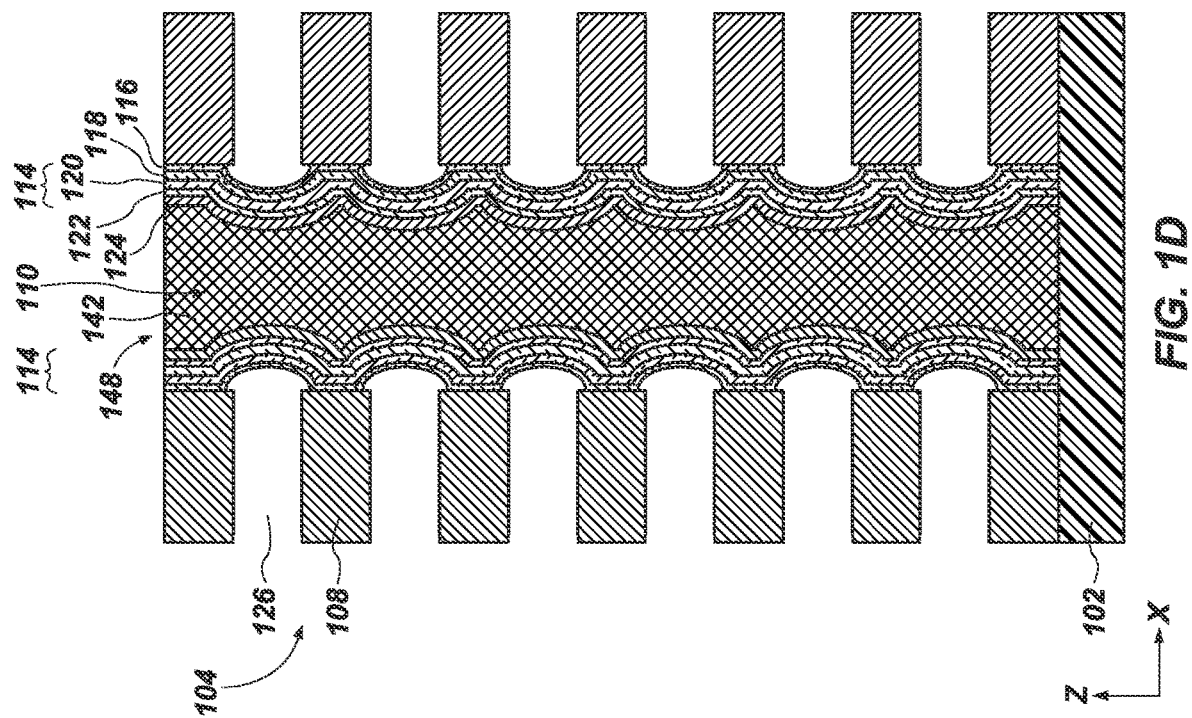
Figure 1C:
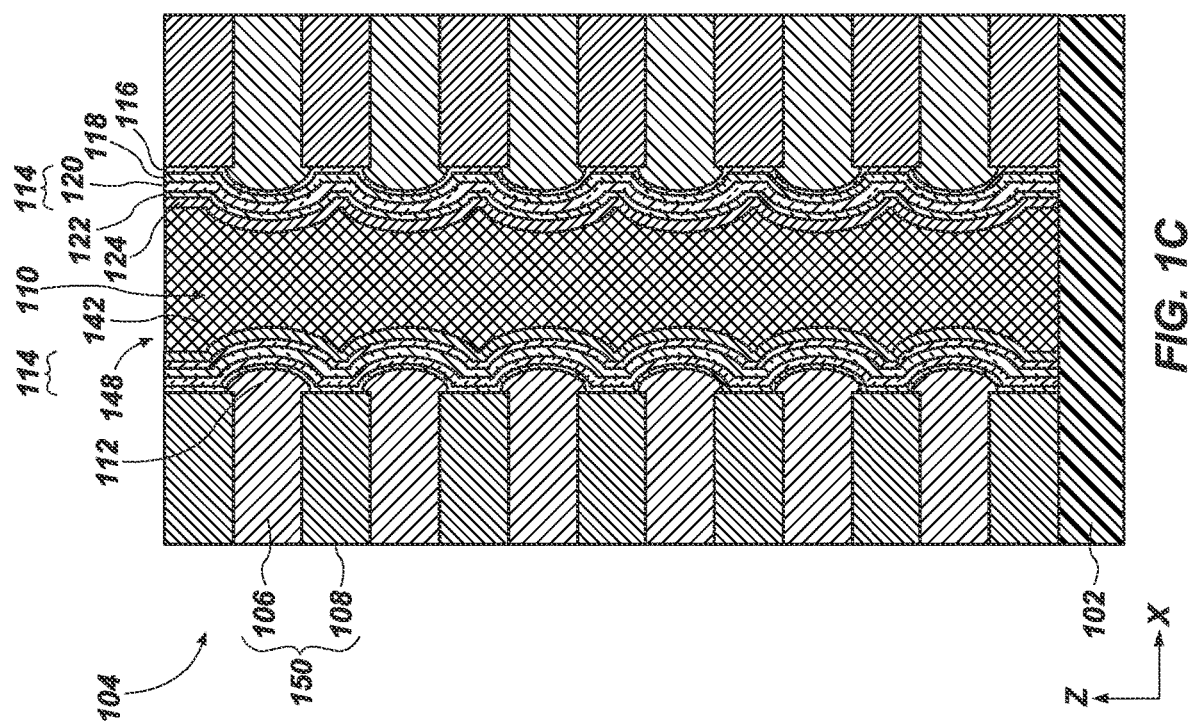
Figure 1F:
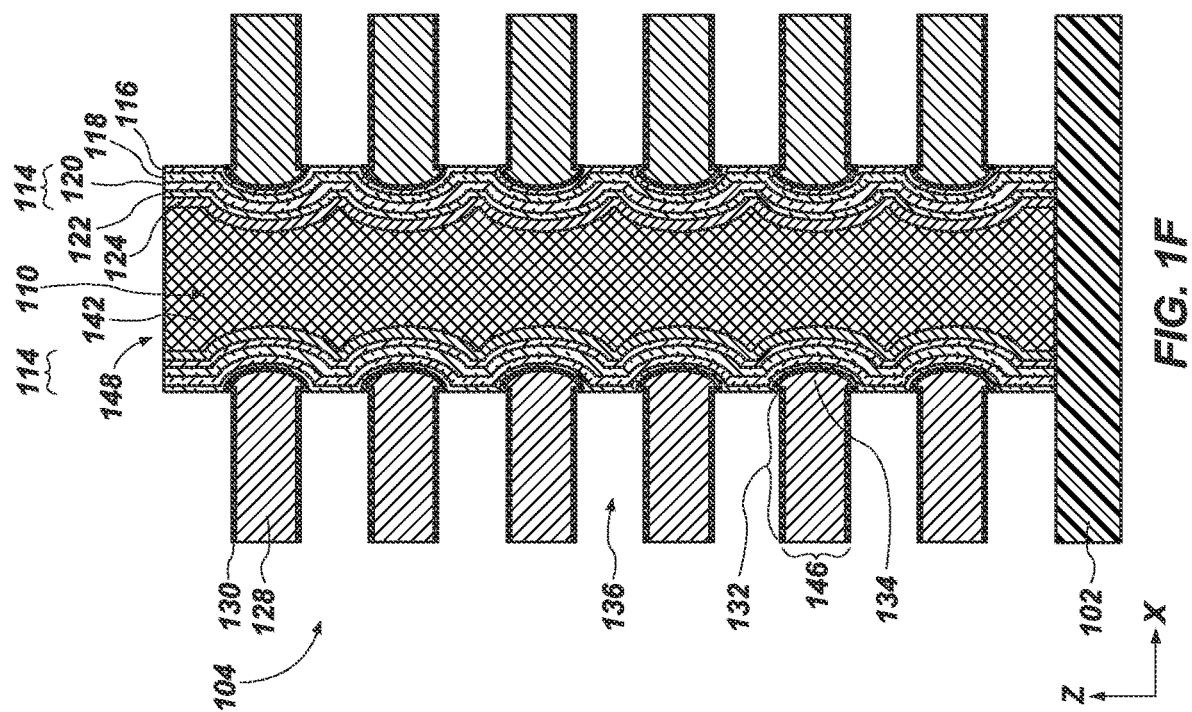
Figure 1E:
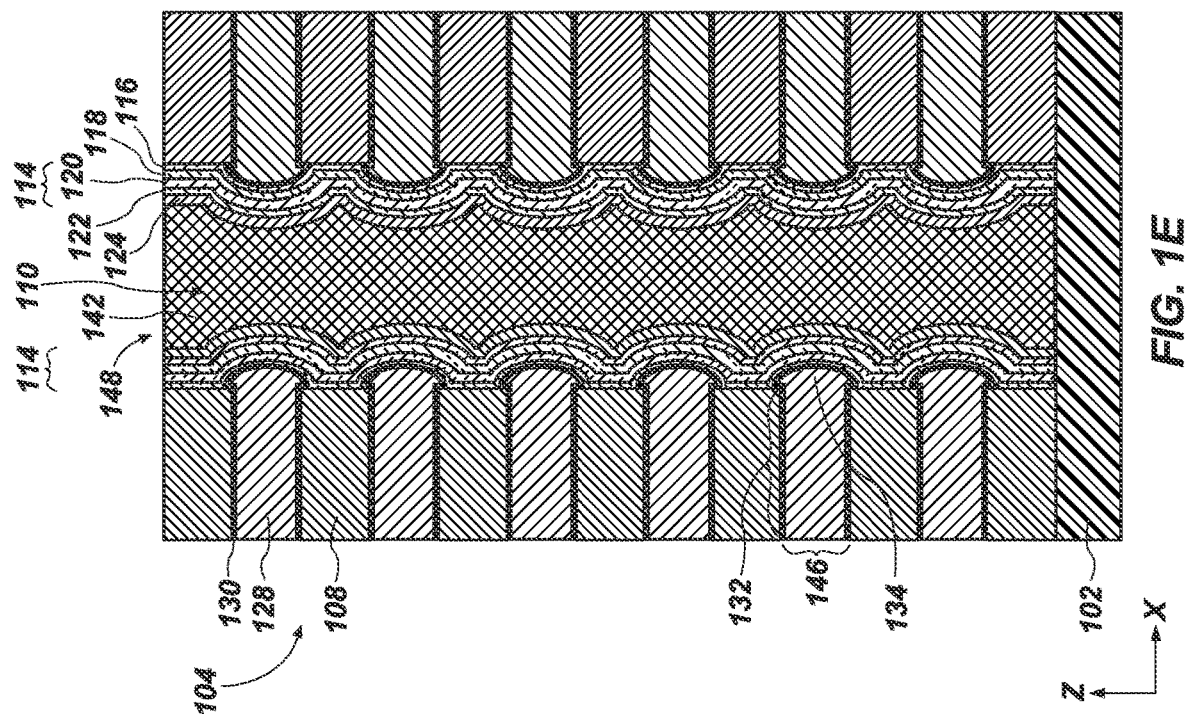
Figure 1H:
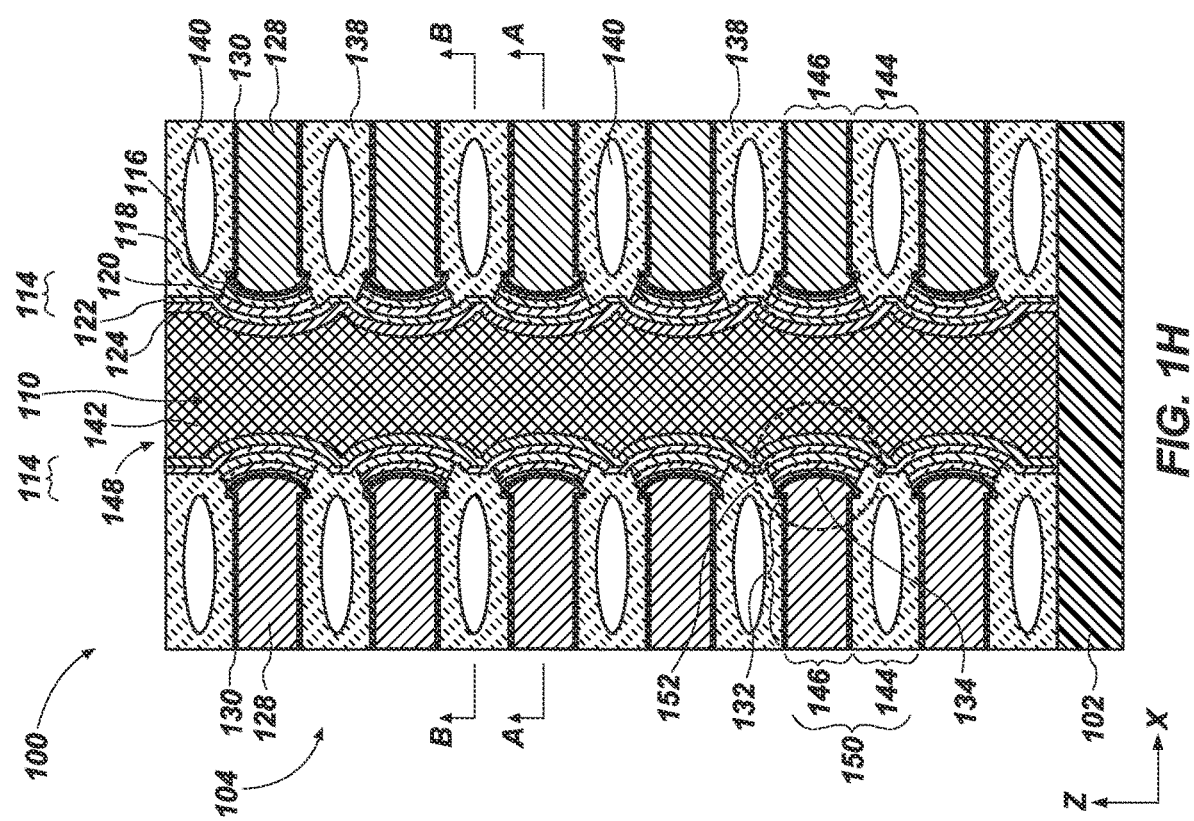
Figure 1I:
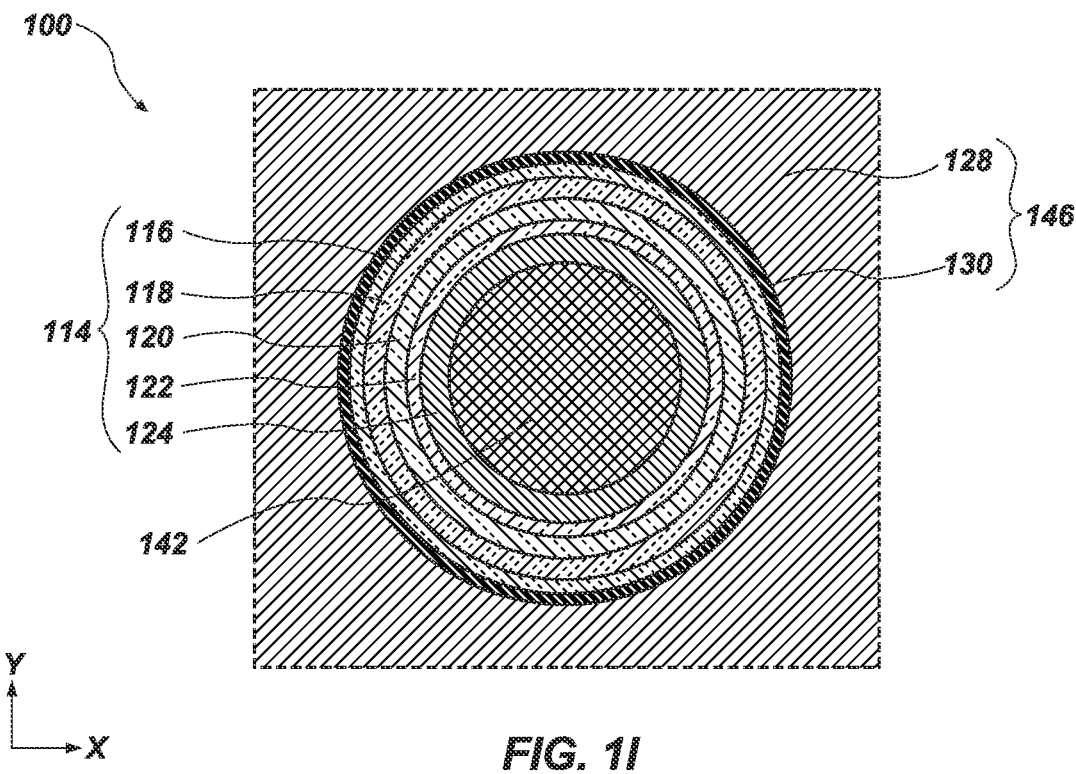
FIG. 1I is a top-down cross-sectional view of the electronic device of FIG. 1H taken along the A-A line.
Figure 1J:
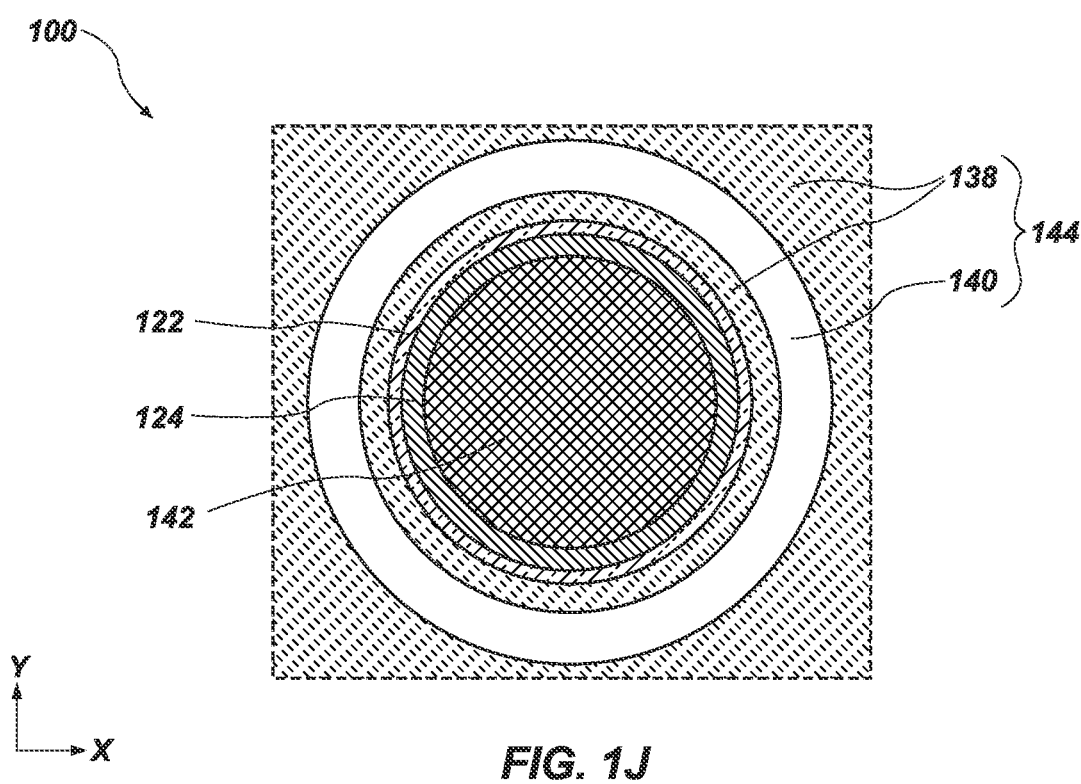
FIG. 1J is a top-down cross-sectional view of the electronic device of FIG. 1H taken along the B-B line.
Figure 2:
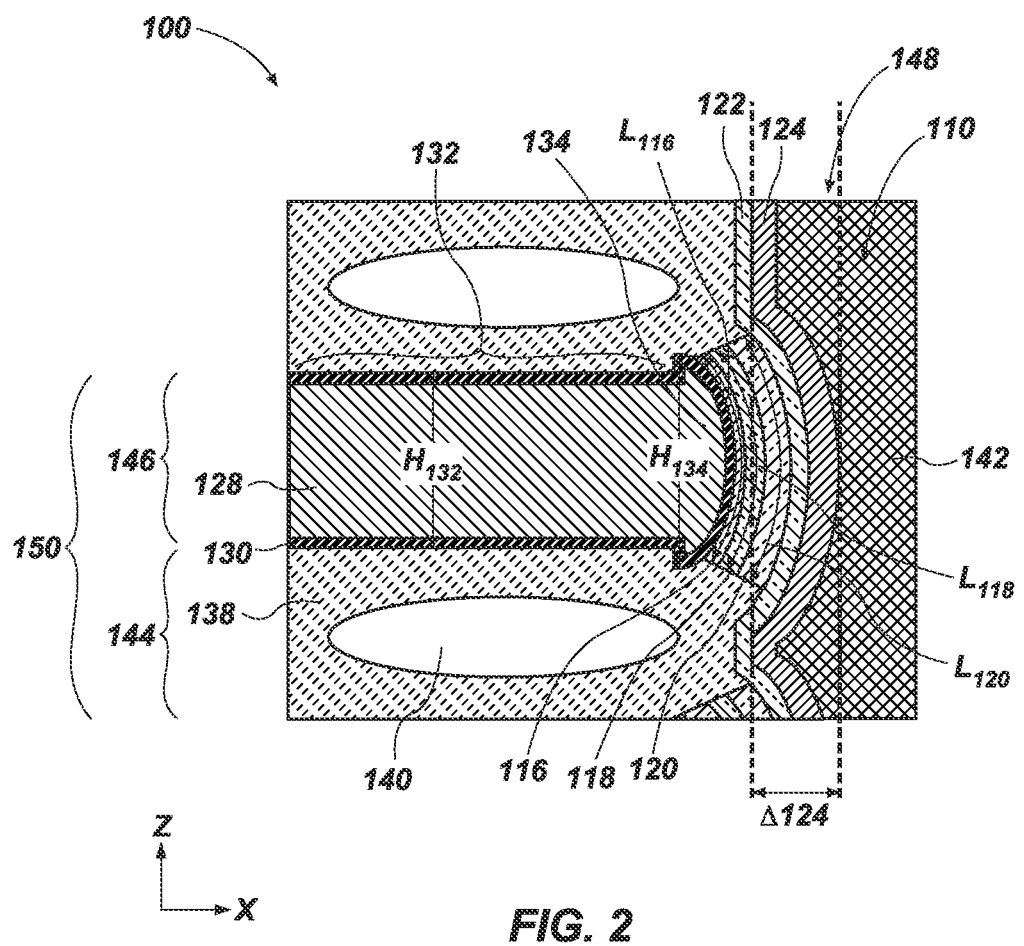
FIG. 2 is a cross-sectional view of an enlarged portion of the electronic device of FIG. 1H.
Figure 3:
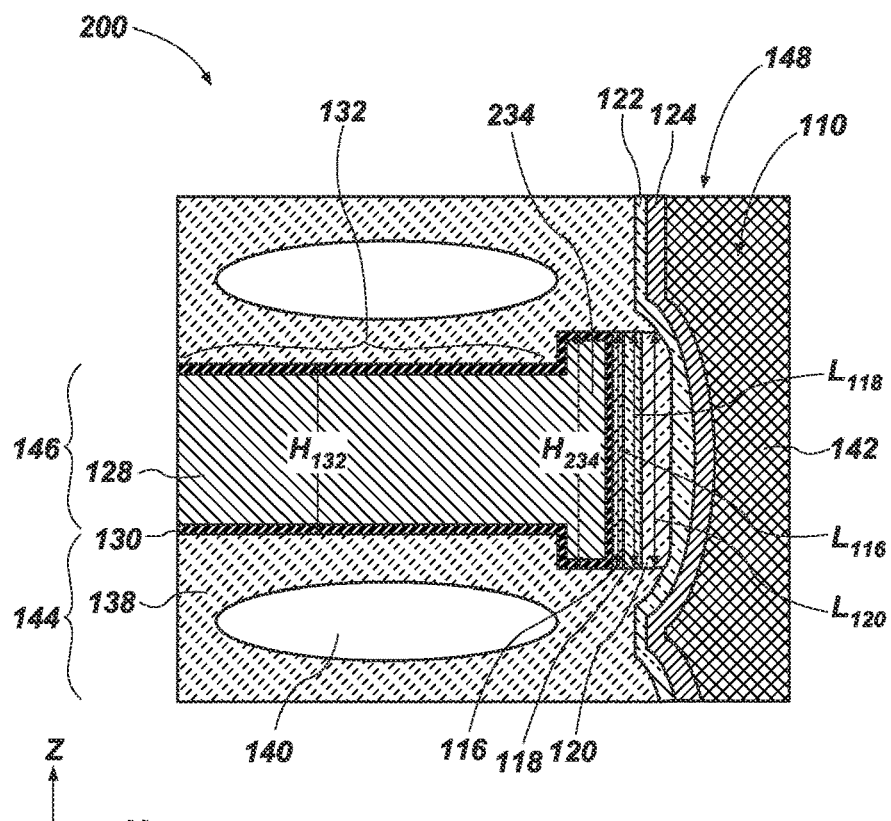
FIG. 3 is a cross-sectional view of an enlarged portion of an electronic device according to additional embodiments of the disclosure.
Figure 4:
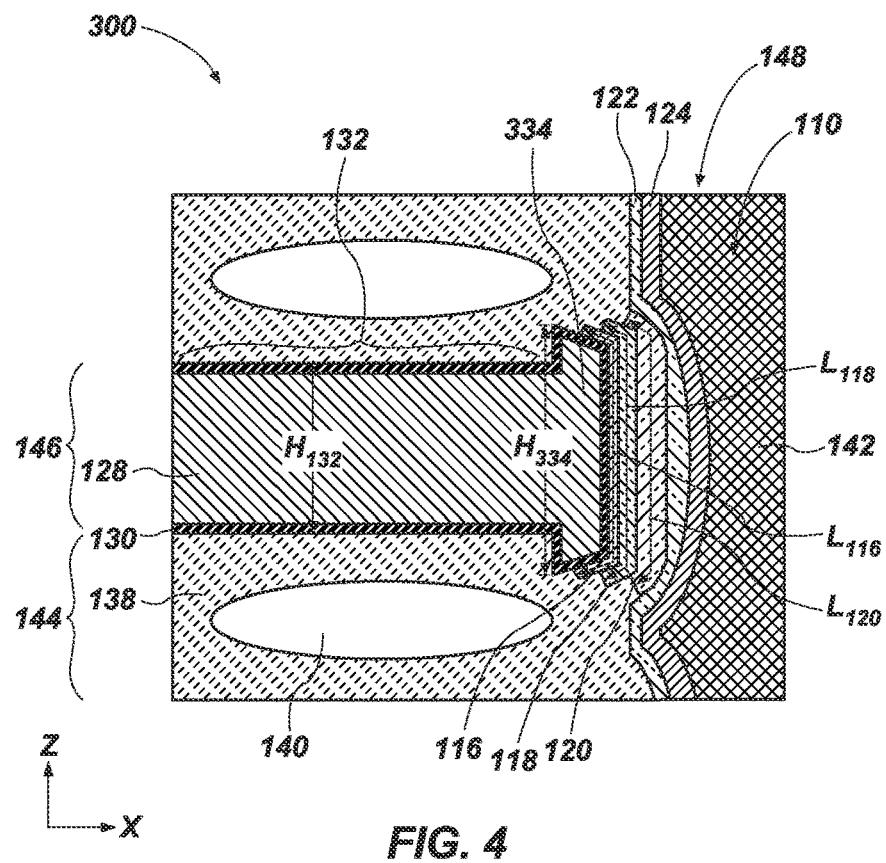
FIG. 4 is a cross-sectional view of an enlarged portion of an electronic device according to other embodiments of the disclosure.

FIGS. 1A through 1J illustrate a method of forming an electronic device 100 (e.g., a memory device) including memory cells, at various stages of the method, according to an embodiment of this disclosure. For simplicity, the formation of a single opening in which the memory cells are formed is illustrated, but it will be understood by one of ordinary skill in the art that the method may include simultaneously forming multiple (e.g., more than one, an array of) openings in which the memory cells are ultimately to be formed. For convenience in describing FIGS. 1A through 1J, a first direction is defined, shown in FIGS. 1A through 1J, as the X-direction. A second direction, which is transverse (e.g., perpendicular) to the first direction is defined, shown in FIGS. 1A through 1H, as the Z-direction. A third direction, which is transverse to the first and second directions is defined, as shown in FIGS. 1I and 1J, as the Y-direction. Similar directions are defined, as shown in FIGS. 2 through 4, as discussed in greater detail below.

The electronic device 100 according to embodiments of the disclosure may be formed as shown in FIGS. 1A through 1H, which are cross-sectional views of the electronic device 100 during fabrication. Referring to FIG. 1A, a stack structure 104 may be formed to include vertically alternating (e.g., in the Z-direction) nitride materials 106 and dielectric materials 108 overlying a substrate (e.g., a base material 102). The stack structure 104 may include multiple vertically alternating nitride materials 106 and dielectric materials 108. A vertically adjacent nitride material 106 and dielectric material 108 or a subsequently formed vertically adjacent conductive material 146 and dielectric material 144 form a tier 150. The electronic device 100 may include one or more decks (not shown). The base material 102 may, for example, be a conductive material, such as a source. The base material 102 may be formed of and include polycrystalline silicon (e.g., doped polycrystalline silicon).

The nitride materials 106 and the dielectric materials 108 of the stack structure 104 may each individually be formed using conventional processes, which are not described in detail herein. As a non-limiting example, the nitride materials 106 and the dielectric materials 108 may each individually be formed through one or more conventional processes (e.g., a PVD process, a CVD process, an ALD process) to form the stack structure 104.

The nitride materials 106 may be formed of and include a sacrificial material that is selectively removable (e.g., selectively etchable) relative to the dielectric materials 108. In some embodiments, the nitride materials 106 may include, consist essentially of, or consist of silicon nitride. The nitride materials 106 may each be substantially planar, and may each independently exhibit any suitable height. In some embodiments, a height of the nitride materials 106 may be within a range of from about 10 nm to about 400 nm. In some embodiments, the nitride materials 106 may have a height within a range of from about 10 nm to about 50 nm. Each of the nitride materials 106 may be substantially the same (e.g., exhibit substantially the same material composition, material distribution, size, and shape) as one another, or at least one of the nitride materials 106 may be different (e.g., exhibit one or more of a different material composition, a different material distribution, a different size, and a different shape) than at least one other nitride material 106. The nitride materials 106 may serve as sacrificial structures for the subsequent formation of conductive materials 146, as described in further detail below.

The dielectric materials 108 may be formed of and include a sacrificial material that is selectively removable relative to subsequently formed conductive materials 146 (see FIG. 1E). The dielectric materials 108 may be formed of a different material than the nitride materials 106 so that the nitride materials 106 are selectively removable relative to the dielectric materials 108. In some embodiments, the dielectric materials 108 may include, consist essentially of, or consist of silicon dioxide. The dielectric materials 108 may each be substantially planar, and may each independently exhibit any suitable height. In some embodiments, a height of the dielectric materials 108 may be within a range of from about 10 nm to about 400 nm. In some embodiments, the dielectric materials 108 may have a height within a range of from about 10 nm to about 50 nm. Each of the dielectric materials 108 may be substantially the same (e.g., exhibit substantially the same material composition, material distribution, size, and shape) as one another, or at least one of the dielectric materials 108 may be different (e.g., exhibit one or more of a different material composition, a different material distribution, a different size, and a different shape) than at least one other dielectric material 108. The dielectric materials 108 may have the same height as the nitride materials 106 or may have a different height relative to the nitride materials 106.

A pillar opening 110 may be formed which vertically extends through the stack structure 104. As shown in FIG. 1A, the pillar opening 110 may include an elongated opening (e.g., aperture, via) exhibiting one end at an uppermost surface of the stack structure 104 and another end at a lowermost surface of the stack structure 104. The pillar opening 110 may have any suitable configuration when viewed from above, and in some embodiments may be circular, elliptical, polygonal, etc. The pillar opening 110 may be a high aspect ratio (HAR) opening extending through the tiers 150, such as having an HAR of at least about 20:1, at least about 50:1, at least about 100:1, or at least about 200:1. Sidewalls of the tiers 150 defining the pillar opening 110 may be substantially vertical or sloped. The pillar opening 110 may include multiple (e.g., more than one) stacked opening portions extending through the electronic device 100 if the electronic device 100 includes multiple decks (not shown). The stacked opening portions may be defined by sidewalls of the tiers 150 and upper and/or lower surfaces of the tiers 150. Sidewalls of the tiers 150 defining the stacked opening portions may be sloped.

Referring to FIG. 1B, a sacrificial material 112 may be selectively formed on portions (e.g., ends) of the nitride materials 106 adjacent to the pillar opening 110. The sacrificial material 112 may, for example, be formed on the portions of the nitride materials 106 proximal to the pillar opening 110. The sacrificial material 112 may have any suitable configuration, such as a circular, elliptical, polygonal, or curvilinear profile when viewed in the X-Y plane. Depending on the shape of the sacrificial material 112, the sacrificial material 112 may overlap with a portion of the dielectric materials 108. However, the sacrificial material 112 is not formed on a major portion of the dielectric materials 108. After forming the sacrificial material 112, sidewalls of the dielectric materials 108 defining the pillar opening 110 may be substantially vertical or sloped. Sidewalls of the nitride materials 106 may be curved, such as exhibiting a convex profile, or may be substantially vertical.

The sacrificial material 112 may be formed of and include a material that is selectively removed (e.g., selectively etched) relative to the dielectric materials 108. The sacrificial material 112 may include one or more of silicon nitride, aluminum oxide, hafnium oxide, borophosphosilicate glass (BPSG), polysilicon, etc. In some embodiments, the sacrificial material 112 includes, consists essentially of, or consists of the same material as the nitride materials 106. A height extending in the Z-direction of the sacrificial material 112 may be greater than the height of the nitride materials 106.

To selectively form the sacrificial material 112, a surface of the ends of the nitride materials 106 may be modified (e.g., chemically modified) such that the sacrificial material 112 is selectively formed on the nitride materials 106. For example, a precursor material may be selectively adsorbed onto the surface of the ends of the nitride materials 106 and the sacrificial material 112 selectively forms on the precursor material. Alternatively, a surface of the ends of the dielectric materials 108 may be modified (e.g., chemically modified) to inhibit formation of the sacrificial material 112. For example, an inhibitor may be selectively adsorbed onto the surface of the dielectric materials 108 proximal the pillar opening 110, preventing (e.g., inhibiting) the sacrificial material 112 from forming on the dielectric materials 108. The sacrificial material 112 may be formed to a desirable width extending in the X-direction. The sacrificial material 112 may, therefore, extend into the pillar opening 110. Since the sacrificial material 112 is selectively formed on the nitride materials 106, sidewalls of the dielectric materials 108 and the sacrificial material 112 are not substantially coplanar. The sacrificial material 112 and the dielectric materials 108 proximal the pillar opening 110 form a substantially non-planar topography extending vertically along the pillar opening 110.

As shown in FIG. 1C, cell films 114 may be formed by conventional techniques adjacent to the sacrificial material 112 and the dielectric materials 108 along the length of the pillar opening 110 extending in the Z-direction. The cell films 114 may extend substantially continuously along sidewalls of the tiers 150. The cell films 114 may be conformally formed, such as by a conventional CVD process or by a conventional ALD process, using conventional processing equipment. The cell films 114 may include one or more of a high-k dielectric material 116, a barrier oxide material 118, a storage node material 120, a tunneling material 122, and a channel material 124. The high-k dielectric material 116, the barrier oxide material 118, the storage node material 120, the tunneling material 122, and the channel material 124 may be sequentially formed.

The high-k dielectric material 116 may be formed laterally adjacent to the sacrificial material 112 and the dielectric materials 108 along the length of the pillar opening 110. The high-k dielectric material 116 may be, for example, formed from aluminum oxide, hafnium oxide, zirconium oxide, tantalum oxide, a combination thereof, or a combination of silicon oxide and one or more of the listed materials. Since the high-k dielectric material 116 is conformally formed, the high-k dielectric material 116 exhibits a topography corresponding to the topography of the sacrificial material 112 and the dielectric materials 108 proximal the pillar opening 110.

The barrier oxide material 118 may be formed laterally adjacent to the high-k dielectric material 116. For example, the barrier oxide material 118 may be formed by one or more of in situ growth, a CVD process, an ALD process, or a PVD process. The barrier oxide material 118 may, for example, be a charge-blocking material that is conformally formed on the high-k dielectric material 116. The barrier oxide material 118 may be any suitable composition, such as a high quality (e.g., highly uniform and highly conformal) silicon oxide material, such as an ALD $SiO_x$. Since the barrier oxide material 118 is conformally formed, the barrier oxide material 118 exhibits a topography corresponding to the topography of the sacrificial material 112 and the dielectric materials 108 proximal the pillar opening 110.

The storage node material 120 (e.g., a nitride storage material, a charge storage material) may be formed laterally adjacent to the barrier oxide material 118. For example, the storage node material 120 may be formed by conventional CVD or conventional ALD processes. As a non-limiting example, the storage node material 120 may include silicon nitride, silicon oxynitride, or a combination thereof. Since the storage node material 120 is conformally formed, the storage node material 120 exhibits a topography corresponding to the topography of the sacrificial material 112 and the dielectric materials 108 proximal the pillar opening 110.

The tunneling material 122 may be formed laterally adjacent to the storage node material 120. The tunneling material 122 may be formed as a so-called "oxide-nitride-oxide" (ONO) structure (e.g., an interlayer poly dielectric structure). Since the tunneling material 122 is conformally formed, the tunneling material 122 exhibits a topography corresponding to the topography of the sacrificial material 112 and the dielectric materials 108 proximal the pillar opening 110.

The channel material 124 may be formed laterally adjacent to the tunneling material 122. For example, the channel material 124 may be formed by conventional CVD or conventional ALD processes. The material of the channel material 124 may be doped polysilicon, undoped polysilicon, or any other suitable channel material. As a non-limiting example, the channel material 124 may be formed of polysilicon. Since the channel material 124 is conformally formed, the channel material 124 exhibits a topography corresponding to the topography of the sacrificial material 112 and the dielectric materials 108 proximal the pillar opening 110. In other words, the topology of the sacrificial material 112 and the dielectric materials 108 may be transferred to the subsequently-formed cell films 114. Portions of the cell films 114 laterally adjacent to the sacrificial material 112 may extend farther into a central portion of the pillar opening 110 relative to portions of the cell films 114 laterally adjacent to the dielectric materials 108.

A fill material 142 may be formed by conventional techniques within the pillar opening 110 to form a pillar 148 (e.g., a memory pillar) comprising the fill material 142 and the cell films 114. The fill material 142 may be formed of and include any suitable dielectric composition. The fill material 142 may extend between the channel materials 124 on either side of the pillar opening 110 and function as a structural support within the electronic device 100. The fill material 142 may substantially fill a remainder of the pillar opening 110 adjacent to the channel material 124. The channel material 124 may substantially surround the fill material 142.

Referring to FIG. 1D, the nitride materials 106 and the sacrificial material 112 are selectively removed to form first openings 126 in the stack structure 104. The nitride materials 106 and the sacrificial material 112 may be removed by conventional techniques, such as by a wet etch process. Conventional etch chemistries and etch conditions may be used to remove the nitride materials 106 and the sacrificial material 112 depending on the material(s) used for the nitride materials 106 and the sacrificial material 112. The etch chemistries and etch conditions may selectively remove the nitride materials 106 and the sacrificial material 112 without substantially removing the dielectric materials 108 or the cell films 114. The first openings 126 may have enlarged portions proximal the cell films 114. The enlarged portion of first openings 126 may have a cross-sectional profile that substantially corresponds to the cross-sectional profile of the sacrificial material 112 when viewed in the X-Y plane. A height extending in the Z-direction of the enlarged portions of the first openings 126 may be greater than a height extending in the Z-direction of the first openings 126 distal to the cell films 114.

After removing the nitride materials 106 and the sacrificial material 112, conductive materials 146 may be formed in the first openings 126, as shown in FIG. 1E. The first openings 126 and the conductive materials 146 may be formed by a so-called "replacement gate" process. An optional liner 130 may be conformally formed on exposed surfaces of the first openings 126 by one or more conventional deposition processes. The liner 130 may include any suitable electrically conductive composition. The liner 130 may be formed of and include, for example, a metal (e.g. titanium, tantalum), a metal nitride (e.g., tungsten nitride, titanium nitride, tantalum nitride), or another material. In some embodiments, the liner 130 includes titanium nitride. In other embodiments, the liner 130 includes aluminum oxide. A conductive material 128 may be formed in the remaining volume of the first openings 126 to form the conductive materials 146. The liner 130 may substantially surround an outer periphery of the conductive material 128. The conductive material 128 may be formed by one or more conventional deposition processes. The conductive material 128 may include any suitable electrically conductive composition. In some embodiments, the conductive material 128 includes, consists essentially of, or consists of tungsten. The conductive materials 146 may have a tier region 132 distal to the cell films 114 and an enlarged region 134 proximal to the cell films 114. The enlarged region 134 of the conductive materials 146 may function as a control gate region. The conductive materials 146 may replicate the shape of the nitride materials 106 and the sacrificial material 112. For example, the conductive materials 146 may have a cross-sectional profile that substantially corresponds to the cross-sectional profile of the nitride materials 106 and the sacrificial material 112 when viewed in the X-Z plane, as shown in FIG. 1B.

Referring to FIG. 1F, the dielectric materials 108 are selectively removed to form second openings 136 in the stack structure 104. The dielectric materials 108 may be removed by conventional techniques, such as by a wet etch process. Conventional etch chemistries and etch conditions may be used to remove the dielectric materials 108 depending on the material(s) used for the dielectric materials 108. The etch chemistries and etch conditions may selectively remove the dielectric materials 108 without substantially removing the conductive material 128, the liner 130, or the cell films 114. The high-k dielectric material 116 may be exposed within the second openings 136 following the removal of the dielectric materials 108.

As shown in FIG. 1G, portions of the high-k dielectric material 116, the barrier oxide material 118, and the storage node material 120 proximal to the second openings 136 may be selectively removed by conventional techniques, such as a wet etch process or a vapor etch process. The portions of the high-k dielectric material 116, the barrier oxide material 118, and the storage node material 120 may be removed by a single removal process or by multiple, sequential removal processes. Conventional etch chemistries and etch conditions may be used to remove the portions of the high-k dielectric material 116, the barrier oxide material 118, and the storage node material 120 proximal to the second openings 136 depending on the materials used for each of the high-k dielectric material 116, the barrier oxide material 118, and the storage node material 120. The etch chemistries and etch conditions may selectively remove the portions of the high-k dielectric material 116, the barrier oxide material 118, and the storage node material 120 without substantially removing the conductive material 128, the liner 130, the tunneling material 122, or the channel material 124. Therefore, the tunneling material 122 and the channel material 124 extend substantially continuously in the pillar opening 110 while discontinuous portions (e.g., segments, discrete segments) of the high-k dielectric material 116, the barrier oxide material 118, and the storage node material 120 are formed. The segments of the high-k dielectric material 116, the barrier oxide material 118, and the storage node material 120 are adjacent to (e.g., laterally adjacent to) the enlarged regions 134 of the conductive materials 146.

Referring to FIG. 1H, dielectric materials 144 may be formed within the second openings 136 vertically adjacent to the conductive materials 146. The dielectric materials 144 may include an oxide material 138 formed to at least partially fill the second openings 136. The oxide material 138 may include any suitable dielectric oxide composition. For example, the oxide material 138 may include, consist essentially of, or consist of silicon dioxide. The oxide material 138 may be formed using one or more conventional deposition processes. Depending on the deposition process used, air gaps 140 may be formed within the oxide material 138 of the dielectric materials 144. The air gaps 140 may have any suitable configuration depending on the amount of the oxide material 138 formed in the second openings 136. The oxide material 138 may provide leakage prevention to the electronic device 100 while the air gaps 140 may provide capacitance reduction. Sidewalls of the oxide material 138 and of the conductive material 128 are not substantially coplanar proximal to the cell films.

Referring to FIG. 1H, the electronic device 100 includes the stack structure 104 with tiers 150 of vertically alternating dielectric materials 144 and conductive materials 146 overlying the base material 102. The pillar 148 comprising the fill material 142 and the cell films 114 is located within the pillar opening 110 extending vertically through the dielectric materials 144 and conductive materials 146 of the stack structure 104. The dielectric materials 144 include the oxide material 138 with the air gaps 140. The conductive materials 146 include the conductive material 128 surrounded by the optional liner 130, with the tier region 132 distal to the cell films 114 and the enlarged region 134 proximal the cell films 114. Individual conductive materials 146 of the stack structure 104 and portions of the cell films 114 laterally adjacent to the individual conductive materials 146 may form an individual memory cell 152. A vertical stack of multiple memory cells 152 within the pillar opening 110 may form a vertical string (e.g., vertical series) of the memory cells 152. The illustrated memory cells 152 in the vertical string may be representative of a large number of substantially identical memory cells formed during fabrication of the electronic device 100. By way of a non-limiting example, the electronic device 100 includes three-dimensional (3D) NAND Flash memory cells. One or more of the lowermost conductive materials 146 may be configured as select gate sources ("SGSs"). One or more of the uppermost conductive materials 146 may be configured as select gate drains ("SGDs"). The conductive materials 146 between the SGS(s) and the SGD(s) may be configured as access lines (e.g., word lines).

FIG. 1I illustrates a simplified partial top-down cross-sectional view of the electronic device 100 taken along the A-A line of FIG. 1H extending horizontally (e.g., in the X-direction) through one of the conductive materials 146. FIG. 1J illustrates a simplified partial top-down cross-sectional view of the electronic device 100 taken along the B-B line of FIG. 1H extending horizontally through one of the dielectric materials 144. Referring to FIG. 1H in combination with FIGS. 1I and 1J, the cell films 114 are disposed laterally adjacent to the enlarged regions 134 of the conductive materials 146 and the sidewalls of the dielectric materials 144 defining the pillar opening 110. The cell films 114 substantially surround the fill material 142 within the pillar opening 110. Discrete segments of the high-k dielectric material 116, the barrier oxide material 118, and the storage node material 120 are disposed laterally adjacent to the enlarged region 134 of conductive materials 146 within the pillar opening 110, as shown in FIG. 1I. The discrete segments of the high-k dielectric material 116, the barrier oxide material 118, and the storage node material 120 do not substantially extend along the sidewalls of the dielectric materials 144 defining the pillar opening 110. The tunneling material 122 and the channel material 124 are disposed laterally adjacent to the storage node material 120 and the dielectric materials 144, as shown in FIGS. 1I and 1J. The tunneling material 122 and the channel material 124 substantially extend along the sidewalls of the dielectric materials 144 defining the pillar opening 110 and over the discrete segments of the high-k dielectric material 116, the barrier oxide material 118, and the storage node material 120 within the pillar opening 110. The cell films 114 exhibit a topography corresponding to the topography of the enlarged regions 134 of the conductive materials 146 and, therefore, portions of the channel material 124 and the tunneling material 122 laterally adjacent to the enlarged regions 134 of the conductive materials 146 extend farther into the pillar opening 110 relative to additional portions of the channel material 124 and the tunneling material 122 laterally adjacent to the dielectric materials 144.

Accordingly, a method of forming an electronic device includes forming pillar openings in a stack structure including vertically alternating nitride materials and dielectric materials, selectively forming a sacrificial material on ends of the nitride materials adjacent to the pillar openings, and forming cell films adjacent to the sacrificial material and the dielectric materials. The cell films include a high-k dielectric material, a barrier oxide material, a storage node material, a tunneling material, and a channel material. The method includes removing the nitride materials and the sacrificial material to form first openings in the stack structure, the first openings having an enlarged portion proximal the cell films, and forming a conductive material in the first openings, the conductive material including a tier region distal to the cell films and an enlarged region proximal to the cell films. The method also includes removing the dielectric materials to form second openings in the stack structure, selectively removing exposed portions of the high-k dielectric material, the barrier oxide material, and the storage node material proximal to the second openings, and forming an oxide material in the second openings to at least partially fill the second openings. A length of the high-k dielectric material and a length of the storage nitride material proximal the enlarged region are each greater than a height of the tier region.

Accordingly, an electronic device includes a stack structure including vertically alternating dielectric materials and conductive materials, the conductive materials including first regions and second regions, and pillars extending vertically through the stack structure, the pillars adjacent to the second regions of the conductive materials. The pillars include cell films adjacent to the second regions, the cell films including a high-k dielectric material, a barrier oxide material, a storage node material, a tunneling material, and a channel material. Segments of each of the high-k dielectric material, the barrier oxide material, and the storage node material are adjacent to the second regions. A length of the segments of high-k dielectric material and a length of the segments of storage node material adjacent to the second regions are greater than a height of the first regions of the conductive materials.

An enlarged view of an individual memory cell 152 is shown in the cross-sectional view of FIG. 2, which is an enlarged view of the circled region indicated by dashed lines in FIG. 1H. The enlarged region 134 of the conductive materials 146 is depicted in FIGS. 1H and 2 as having a rounded profile when viewed in the X-Z plane. However, the enlarged region 134 may have additional configurations, as shown in FIGS. 3 and 4. The enlarged region 134 may, for example, have a rectangular or polygonal profile when viewed in the X-Z plane. A configuration of the enlarged region 134 may be selected to achieve desired electrical performance of the electronic device 100 containing the memory cells 152. The enlarged region 134 has a height $H_{134}$ (including the height of the conductive material 128 and the liner 130) extending in the Z-direction that is greater than a height $H_{132}$ (including the height of the conductive material 128 and the liner 130) extending in the Z-direction of the tier region 132. The height $H_{134}$ is measured as a maximal distance between upper and lower surfaces of a respective enlarged region 134. By way of non-limiting example, the height $H_{134}$ may be greater than the height $H_{132}$ by an amount within a range of from about 0.5 nm to about 5 nm, such as from about 0.5 nm to about 1 nm, from about 0.5 nm to about 2 nm, from about 1 nm to about 2 nm, from about 1 nm to about 3 nm, from about 1 nm to about 4 nm, from about 1 nm to about 5 nm, from about 2 nm to about 3 nm, from about 2 nm to about 4 nm, from about 2 nm to about 5 nm, from about 3 nm to 4 nm, from about 3 nm to 5 nm, or from about 4 nm to about 5 nm.

The high-k dielectric material 116 of the cell films 114 is disposed laterally adjacent to the conductive materials 146 proximal the enlarged regions 134. Discrete segments of the high-k dielectric material 116 are disposed adjacent to the conductive materials 146 within the pillar opening 110. While a portion of the high-k dielectric material 116 contacts the dielectric materials 144, the high-k dielectric material 116 does not substantially extend along sidewalls of the dielectric materials 144. The segments of the high-k dielectric material 116 have a length $L_{116}$ that is greater than the height $H_{132}$ of the tier region 132 of the conductive materials 146. Since the high-k dielectric material 116 exhibits the curved (e.g., bowed) topography of the underlying enlarged region 134, the length $L_{116}$ is measured as a maximal distance between upper and lower surfaces of the high-k dielectric material 116. By way of a non-limiting example, the length $L_{116}$ may be greater than the height $H_{132}$ by an amount within a range of from about 2 nm to about 15 nm, such as from about 2 nm to about 3 nm, from about 2 nm to about 5 nm, from about 2 nm to about 10 nm, from about 2 nm to about 15 nm, from about 3 nm to about 5 nm, from about 3 nm to about 7 nm, from about 3 nm to about 10 nm, from about 3 nm to about 12 nm, from about 3 nm to about 15 nm, from about 5 nm to about 8 nm, from about 5 nm to about 10 nm, from about 5 nm to about 12 nm, from about 7 nm to about 10 nm, from about 7 nm to about 12 nm, from about 7 nm to about 15 nm, from about 10 nm to about 12 nm, from about 10 nm to about 14 nm, from about 10 nm to about 15 nm, from about 11 nm to about 13 nm, from about 12 nm to about 14 nm, from about 13 nm to about 15 nm, or from about 14 nm to about 15 nm. The length $L_{116}$ of the segments of the high-k dielectric material 116 may also be greater than the height $H_{134}$ of the enlarged regions 134. The high-k dielectric material 116 may have a substantially uniform thickness extending in the X-direction. In some embodiments the high-k dielectric 116 may have a thickness extending in the X-direction within a range of from about 1 nm to about 5 nm.

The barrier oxide material 118 is disposed laterally adjacent to the high-k dielectric material 116. The barrier oxide material 118 includes discrete segments of the barrier oxide material 118 selectively disposed adjacent to the high-k dielectric material 116 within the pillar opening 110. While a portion of the barrier oxide material 118 contacts the dielectric materials 144, the barrier oxide material 118 does not substantially extend along sidewalls of the dielectric materials 144. The segments of the barrier oxide material 118 have a length $L_{118}$ that is greater than or equal to the height $H_{132}$ of the tier region 132 of the conductive materials 146. Since the barrier oxide material 118 exhibits the curved (e.g., bowed) topography of the underlying enlarged region 134, the length $L_{118}$ is measured as a maximal distance between upper and lower surfaces of the barrier oxide material 118. The length $L_{118}$ of the segments of the barrier oxide material 118 may also be greater than the height $H_{134}$ of the enlarged regions 134. The length $L_{118}$ of the segments of the barrier oxide material 118 may, additionally, be greater than the length $L_{116}$ of the segments of the high-k dielectric material 116.

The storage node material 120 is disposed laterally adjacent to the barrier oxide material 118. The storage node material 120 includes discrete segments of the storage node material 120 selectively disposed adjacent to the barrier oxide material 118 within the pillar opening 110. While a portion of the storage node material 120 contacts the dielectric materials 144, the storage node material 120 does not substantially extend along sidewalls of the dielectric materials 144. A portion of the storage node material 120 may function as a charge trap region during use and operation of the electronic device 100. The segments of the storage node material 120 have a length $L_{uo}$ that is greater than or equal to the height $H_{132}$ of the tier region 132 of the conductive materials 146. Since the storage node material 120 exhibits the curved (e.g., bowed) topography of the underlying enlarged region 134, the length $L_{120}$ is measured as a maximal distance between upper and lower surfaces of the storage node material 120. By way of a non-limiting example, the length Luo may be greater than the height $H_{132}$ by an amount within a range of from about 2 nm to about 15 nm, such as from about 2 nm to about 3 nm, from about 2 nm to about 5 nm, from about 2 nm to about 10 nm, from about 2 nm to about 15 nm, from about 3 nm to about 5 nm, from about 3 nm to about 7 nm, from about 3 nm to about 10 nm, from about 3 nm to about 12 nm, from about 3 nm to about 15 nm, from about 5 nm to about 8 nm, from about 5 nm to about 10 nm, from about 5 nm to about 12 nm, from about 7 nm to about 10 nm, from about 7 nm to about 12 nm, from about 7 nm to about 15 nm, from about 10 nm to about 12 nm, from about 10 nm to about 14 nm, from about 10 nm to about 15 nm, from about 11 nm to about 13 nm, from about 12 nm to about 14 nm, from about 13 nm to about 15 nm, or from about 14 nm to about 15 nm. The length Luo of the segments of the storage node material 120 may also be greater than the height $H_{134}$ of the enlarged regions 134. The length $L_{120}$ of the segments of the storage node material 120 may be greater than the length $L_{118}$ of the barrier oxide material 118. The length $L_{120}$ of the segments of the storage node material 120 may, additionally, be greater than the length $L_{116}$ of the segments of the high-k dielectric material 116.

The tunneling material 122 is disposed laterally adjacent to the storage node material 120. The tunneling material 122 continuously extends over the storage node material 120 and the sidewalls of the dielectric materials 144 defining the pillar opening 110. The tunneling material 122 conforms to the storage node material 120 and the sidewalls of the dielectric materials 144 defining the pillar opening 110. Portions of the tunneling material 122 laterally adjacent to the conductive materials 146 extend farther into the central portion of the pillar opening 110 relative to portions of the tunneling material 122 laterally adjacent to the dielectric materials 144.

The channel material 124 is disposed laterally adjacent to the tunneling material 122 and continuously extends over the tunneling material 122 and, optionally, over the exposed upper surface of the base material 102. The channel material 124 may, however, only be present on the sidewalls of the tunneling material 122. The channel material 124 conforms to the tunneling material 122 and the exposed upper surface of the base material 102. Portions of the channel material 124 laterally adjacent to the conductive materials 146 extend farther into the central portion of the pillar opening 110 relative to portions of the channel material 124 laterally adjacent to the dielectric materials 144. An extent to which the channel material 124 laterally adjacent to the conductive materials 146 extends into the pillar opening 110 is shown in FIG. 2 as 4124. The remaining volume of the pillar opening 110 is filled with the fill material 142 to form the pillar 148 (see FIG. 1C). The fill material 142 extends between inner sidewalls of the channel material 124. The fill material 142 conforms to the channel material 124, such that the fill material 142 exhibits varying widths in the X-direction along the vertical Z-direction according to the topography of the channel material 124. For example, portions of the fill material 142 of the pillar 148 horizontally aligned with the conductive materials 146 may be narrower relative to additional portions of the fill material 142 of the pillar 148 horizontally aligned with the dielectric materials 138.

An enlarged view of an individual memory cell of an electronic device 200 according to another embodiment of the disclosure is shown in FIG. 3. The electronic device 200 may be substantially similar to the electronic device 100 previously described with reference to FIGS. 1H and 2, and may be formed by the same process previously described with reference to FIGS. 1A through 1H. Unless otherwise specified, the material types, material thicknesses, etc., of the electronic device 200 are as described above for FIGS. 1A through 2. The electronic device 200 differs from the electronic device 100 in the configuration of the enlarged region 234 of the conductive materials 146 and of the cell films 114 laterally adjacent to the enlarged region 234. The enlarged region 234 of the electronic device 200 has a rectangular profile when viewed from the X-Z plane. During formation of the electronic device 200, the deposited sacrificial material 112 depicted in FIG. 1B may have a rectangular profile corresponding to the rectangular profile of the enlarged region 234. The enlarged region 234 has a height $H_{234}$ extending in the Z-direction that is greater than the height $H_{132}$ extending in the Z-direction of the tier region 132. The height $H_{234}$ is measured as a maximal distance between upper and lower surfaces of a respective enlarged region 234.

The cell films 114 include discrete segments of the high-k dielectric material 116, barrier oxide material 118, and storage node material 120 disposed laterally adjacent to the enlarged region 234, and the tunneling material 122 and channel material 124 continuously extend over the storage node material 120 and the sidewalls of the dielectric materials 144 defining the pillar opening 110. The high-k dielectric material 116 has a length $L_{116}$ that is greater than the height $H_{132}$ of the tier region 132 of the conductive materials 146. The barrier oxide material 118 has a length $L_{118}$ that is greater than the height $H_{132}$ of the tier region 132 of the conductive materials 146. The storage node material 120 has a length $L_{12}°$ that is greater than the height $H_{132}$ of the tier region 132 of the conductive materials 146. The lengths $L_{116}$, $L_{118}$, $L_{120}$ may be substantially the same as the height $H_{234}$ of the enlarged region 234. Since the cell films 114 are conformally formed, the cell films 114 exhibit a topography corresponding to the topography of the enlarged regions 234. Portions of the channel material 124 and the tunneling material 122 laterally adjacent to the conductive materials 146 extend farther into a central portion of the pillar opening 110 relative to portions of the channel material 124 and the tunneling material 122 laterally adjacent to the dielectric materials 144.

An enlarged view of an individual memory cell of an electronic device 300 according to another embodiment of the disclosure is shown in FIG. 4. The electronic device 300 may be substantially similar to the electronic device 100 previously described with reference to FIGS. 1H and 2, and may be formed by the same process previously described with reference to FIGS. 1A through 1H. Unless otherwise specified, the material types, material thicknesses, etc., of the electronic device 300 are as described above for FIGS. 1A through 2. The electronic device 300 differs from the electronic device 100 in the configuration of an enlarged region 334 of the conductive materials 146 and of the cell films 114 laterally adjacent to the enlarged region 334. The enlarged region 334 of the electronic device 300 has a trapezoidal profile when viewed from the X-Z plane. During formation of the electronic device 300, the deposited sacrificial material 112 depicted in FIG. 1B may have a trapezoidal profile corresponding to the trapezoidal profile of the enlarged region 334. The enlarged region 334 has a height $H_{334}$ extending in the Z-direction that is greater than the height $H_{132}$ extending in the Z-direction of the tier region 132. The height $H_{334}$ is measured as a maximal distance between upper and lower surfaces of a respective enlarged region 334.

The cell films 114 include discrete segments of the high-k dielectric material 116, barrier oxide material 118, and storage node material 120 disposed laterally adjacent to the enlarged region 334 and the tunneling material 122 and channel material 124 continuously extending over the storage node material 120 and the sidewalls of the dielectric materials 144 defining the pillar opening 110. The high-k dielectric material 116 has a length $L_{116}$ that is greater than the height $H_{132}$ of the tier region 132 of the conductive materials 146. The barrier oxide material 118 has a length $L_{118}$ that is greater than the height $H_{132}$ of the tier region 132 of the conductive materials 146. The storage node material 120 has a length $L_{120}$ that is greater than the height $H_{132}$ of the tier region 132 of the conductive materials 146. Since the cell films 114 are conformally formed, the cell films 114 exhibit a topography corresponding to the topography of the enlarged regions 334. Portions of the channel material 124 and the tunneling material 122 laterally adjacent to the conductive materials 146 extend farther into a central portion of the pillar opening 110 relative to portions of the channel material 124 and the tunneling material 122 laterally adjacent to the dielectric materials 144.

The selective formation of the sacrificial material 112 on the nitride materials 106 may enable enlarged regions 134 of the conductive materials 146 of the tiers 150 to be formed according to embodiments of the disclosure. The enlarged regions 134 may be formed proximal to the pillars 148. The cell films 114 are formed proximal to the enlarged regions 134. The conductive materials 146 may function as control gates, with the enlarged regions 134 providing an increased cell area relative to conventional conductive materials 146 lacking the enlarged regions 134. The increased cell area results in an increased program/erase window. By forming some of the cell films 114, such as the storage node material 120, to be discrete segments exhibiting longer lengths than the height $H_{132}$ of the tier region 132 distal to the cell films 114, reduced cell to cell interference is achieved without program/erase window degradation. In addition, since the storage node material 120 is separated into discrete segments, trapped charge distribution within the memory cells 152 is confined and charge migration between neighboring memory cells 152 is suppressed.

Figure 5:
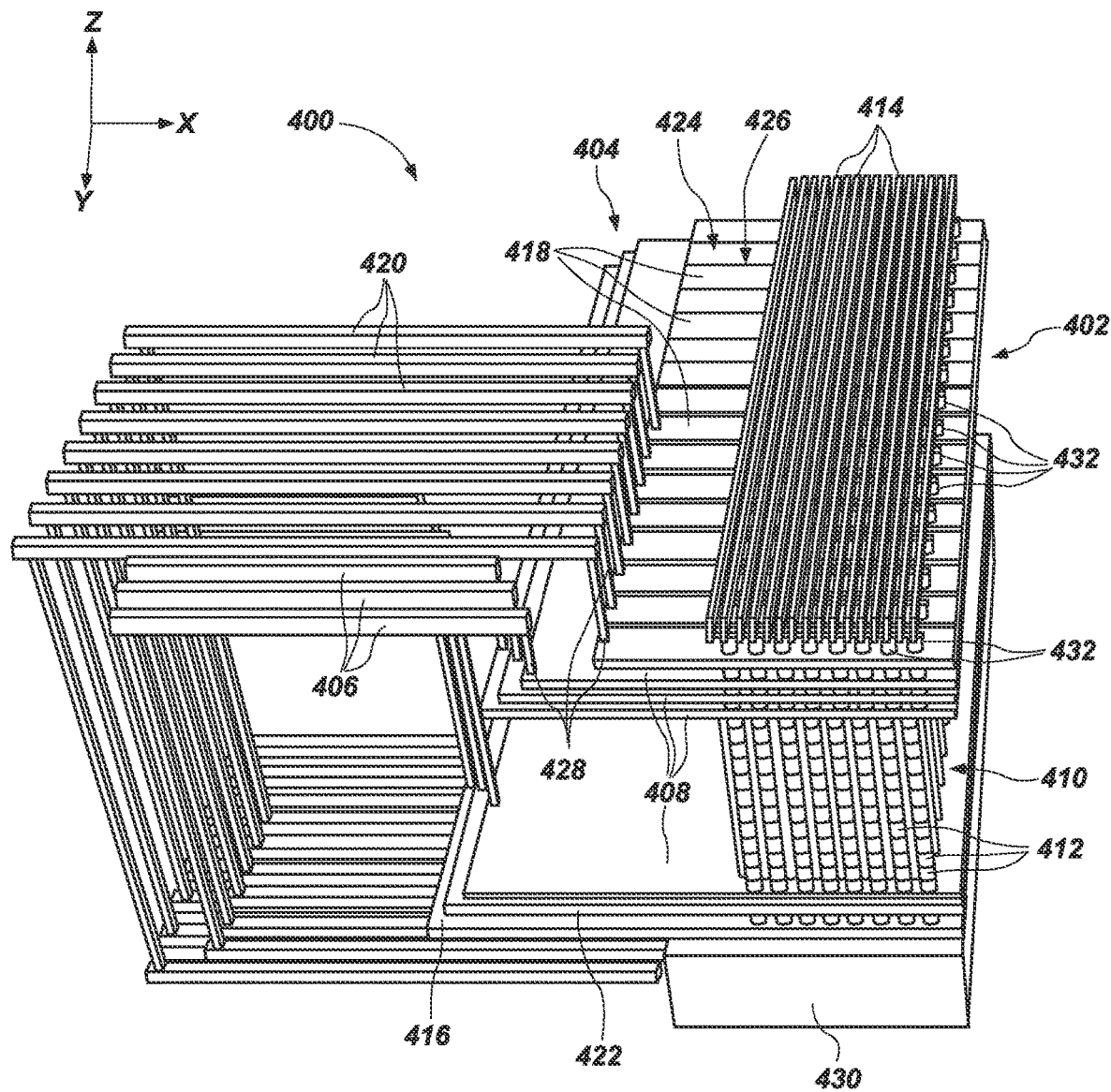
FIG. 5 is a partial cutaway perspective view of an electronic device according to embodiments of the disclosure.

FIG. 5 illustrates a partial cutaway perspective view of a portion of an electronic device 400 (e.g., a microelectronic device, a memory device, such as a 3D NAND Flash memory device) including an electronic structure 402 (e.g., a microelectronic device structure). The electronic structure 402 may be substantially similar to the electronic devices 100, 200, and 300 previously described with reference to FIGS. 1A through 4. For convenience in describing FIG. 5, a first direction may be defined as the X-direction. A second direction, which is transverse (e.g., perpendicular) to the first direction may be defined as the Y-direction. A third direction, which is transverse (e.g., perpendicular) to the first and second directions may be defined as the Z-direction.

As shown in FIG. 5, the electronic structure 402 may include a staircase structure 404 defining contact regions for connecting access lines 406 to conductive structures 408 (e.g., corresponding to the conductive materials 146 (FIG. 1H)). The electronic structure 402 may include vertical strings 410 of memory cells 412 (e.g., the memory cell 148 (FIG. 1H)) that are coupled to each other in series. The vertical strings 410 may extend vertically (e.g., in the Z-direction) and orthogonally to conductive lines and the conductive structures 408, such as data lines 414, a source tier 416, first select gates 418 (e.g., upper select gates, drain select gates (SGDs)), select lines 420, and a second select gate 422 (e.g., a lower select gate, a source select gate (SGS)). The first select gates 418 may be horizontally divided (e.g., in the Y-direction) into multiple blocks 424 horizontally separated from one another by slots 426.

Vertical conductive contacts 428 may electrically couple components to each other as shown. For example, the select lines 420 may be electrically coupled to the first select gates 418 and the access lines 406 may be electrically coupled to the conductive structures 408. The electronic device 400 may also include a control unit 430 positioned under the memory array, which may include at least one of string driver circuitry, pass gates, circuitry for selecting gates, circuitry for selecting conductive lines (e.g., the data lines 414, the access lines 406), circuitry for amplifying signals, and circuitry for sending signals. The control unit 430 may be electrically coupled to the data lines 414, the source tier 416, the access lines 406, the first select gates 418, and the second select gate 422, for example. In some embodiments, the control unit 430 includes CMOS (complementary metal-oxide-semiconductor) circuitry. In such embodiments, the control unit 430 may be characterized as having a "CMOS under Array" ("CuA") configuration.

The first select gates 418 may extend horizontally in a first direction (e.g., the X-direction) and may be coupled to respective first groups of vertical strings 410 of memory cells 412 at a first end (e.g., an upper end) of the vertical strings 410. The second select gate 422 may be formed in a substantially planar configuration and may be coupled to the vertical strings 410 at a second, opposite end (e.g., a lower end) of the vertical strings 410 of memory cells 412.

The data lines 414 (e.g., digit lines, bit lines) may extend horizontally in a second direction (e.g., in the Y-direction) that is at an angle (e.g., perpendicular) to the first direction (e.g., the X-direction) in which the first select gates 418 extend. Individual data lines 414 may be coupled to individual groups of the vertical strings 410 extending in the second direction (e.g., the Y-direction) at the first end (e.g., the upper end) of the vertical strings 410 of the individual groups. Additional individual groups of the vertical strings 410 extending in the first direction (e.g., the X-direction) and coupled to individual first select gates 418 may share a particular vertical string 410 thereof with individual groups of vertical strings 410 coupled to an individual data line 414. Thus, an individual vertical string 410 of memory cells 412 may be selected at an intersection of an individual first select gate 418 and an individual data line 414. Accordingly, the first select gates 418 may be used for selecting memory cells 412 of the vertical strings 410 of memory cells 412.

The conductive structures 408 (e.g., word lines) may extend in respective horizontal planes. The conductive structures 408 may be stacked vertically, such that each conductive structure is coupled to at least some of the vertical strings 410 of memory cells 412, and the vertical strings 410 of the memory cells 412 extend vertically through the stack structure including the conductive structures 408. The conductive structures 408 may be coupled to or may form control gates of the memory cells 412.

The first select gates 418 and the second select gate 422 may operate to select a vertical string 410 of memory cells 412 interposed between data lines 414 and the source tier 416. Thus, an individual memory cell 412 may be selected and electrically coupled to a data line 414 by operation of (e.g., by selecting) the appropriate first select gate 418, second select gate 422, and conductive structure 408 that are coupled to the particular memory cell 412.

The staircase structure 404 may be configured to provide electrical connection between the access lines 406 and the conductive structures 408 through the vertical conductive contacts 428. In other words, an individual conductive structure 408 may be selected via an access line 406 in electrical communication with a respective vertical conductive contact 428 in electrical communication with the conductive structure 408. The data lines 414 may be electrically coupled to the vertical strings 410 of memory cells 412 through conductive contact structures 432.

Figure 6:
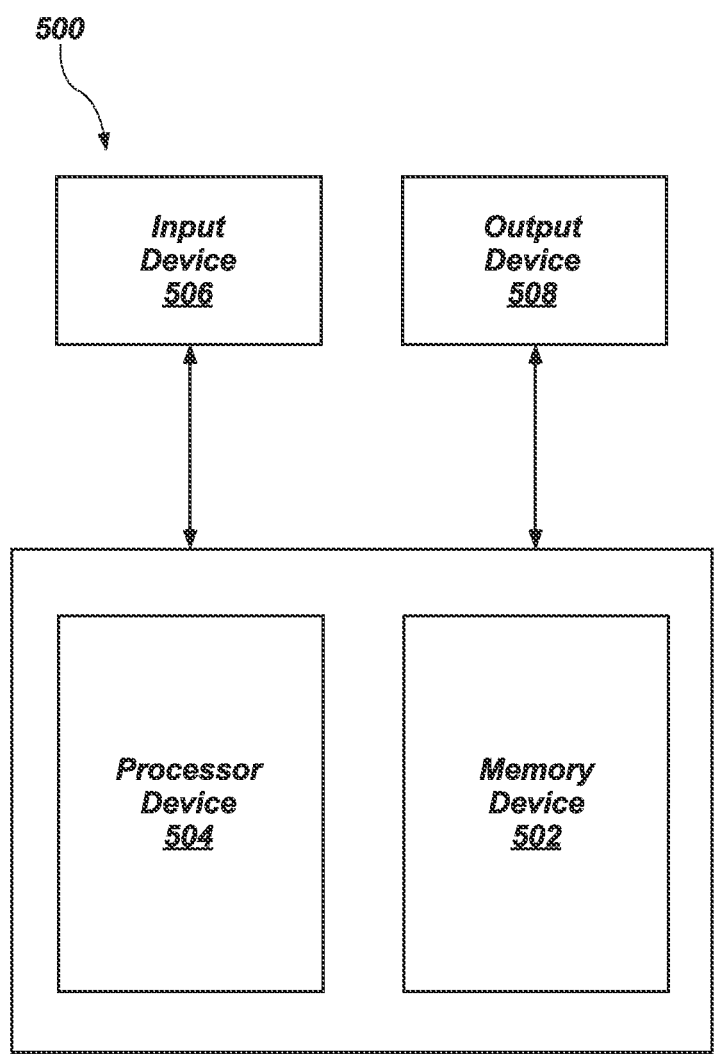
FIG. 6 is a block diagram of an electronic system according to embodiments of the disclosure.

Electronic devices (e.g., the electronic devices 100, 200, 300) including the enlarged regions 134, 234, 334 in the conductive materials 146, according to embodiments of the disclosure may be used in embodiments of electronic systems of the disclosure. For example, FIG. 6 is a block diagram of an electronic system 500, in accordance with embodiments of the disclosure. The electronic system 500 may include, for example, a computer or computer hardware component, a server or other networking hardware component, a cellular telephone, a digital camera, a personal digital assistant (PDA), portable media (e.g., music) player, a Wi-Fi or cellular-enabled tabled such as, for example, an iPAD® or SURFACE® tablet, an electronic book, a navigation device, etc. The electronic system 500 includes at least one memory device 502. The memory device 502 may include, for example, an embodiment of an electronic device previously described herein (e.g., the electronic devices 100, 200, 300, 400 previously described with reference to FIGS. 1A through 5) including the enlarged regions 134, 234, 334 in the conductive materials 146.

The electronic system 500 may further include at least one electrical signal processor device 504 (e.g., a microprocessor). The electrical signal processor device 504 may, optionally, include an embodiment of an electronic device previously described herein (e.g., the electronic devices 100, 200, 300, 400 previously described with reference to FIGS. 1A through 5). The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, a monitor, a display, a printer, an audio output jack, a speaker, etc. In some embodiments, the input device 506 and the output device 508 may include a single device that can be used to both input information to the electronic system 500 and to output information to a user. For example, the input device 506 and the output device 508 may include a single touchscreen device that can input information from a user to the electronic system 500 and output visual information to a user. The input device 506 and the output device 508 may communicate electrically with one or more of the memory device 502 and the electronic signal processor devices 504.

Figure 7:
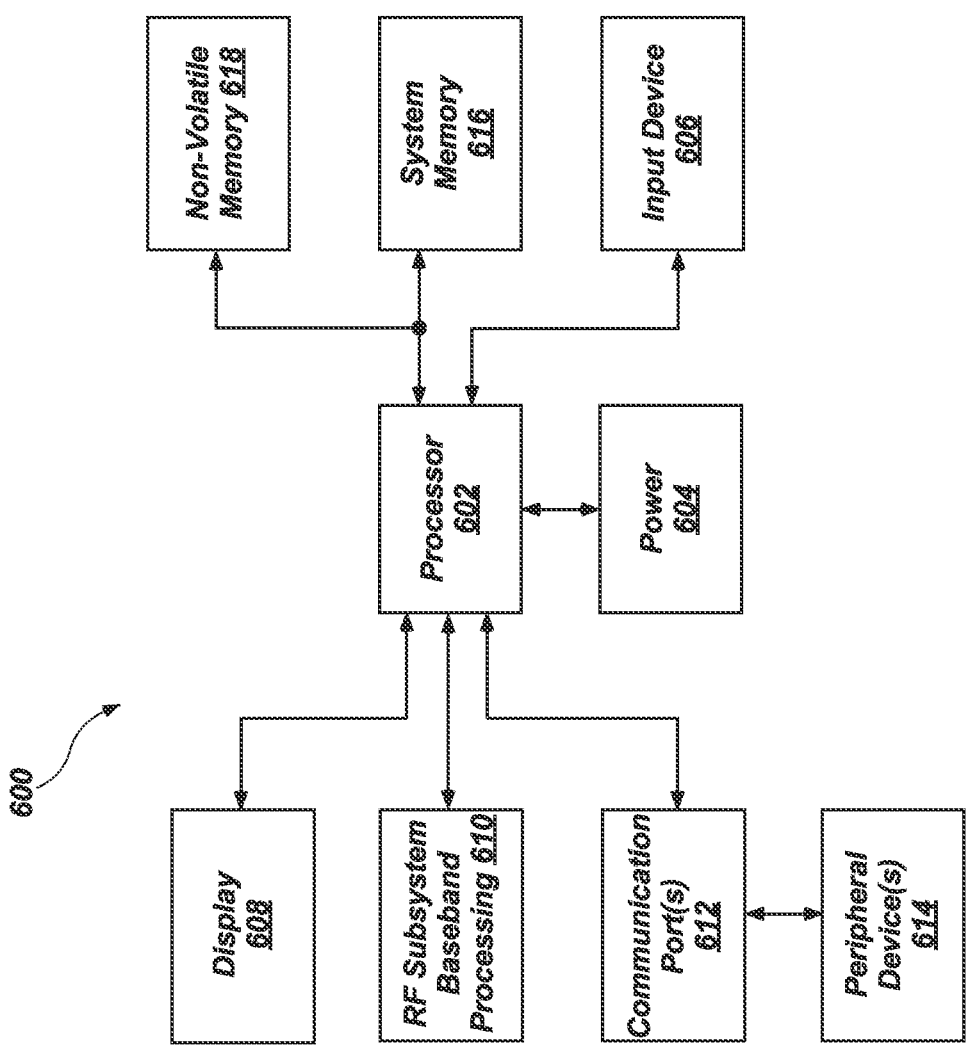
FIG. 7 is a block diagram of a process-based system according to embodiments of the disclosure.

With reference to FIG. 7, a processor-based system 600 is depicted. The processor-based system 600 may include various electronic devices (e.g., one or more of the electronic devices 100, 200, 300, 400) manufactured in accordance with embodiments of the disclosure. The processor-based system 400 may be any of a variety of types such as a computer, pager, cellular phone, personal organizer, control circuit, or other electronic device. The processor-based system 600 may include one or more processors 602, such as a microprocessor, to control the processing of system functions and requests in the processor-based system 600. The processor 602 and other subcomponents of the processor-based system 600 may include electronic devices (e.g., one or more of the electronic devices 100, 200, 300, 400) manufactured in accordance with embodiments of the disclosure.

The processor-based system 600 may include a power supply 604 in operable communication with the processor 602. For example, if the processor-based system 600 is a portable system, the power supply 604 may include one or more of a fuel cell, a power scavenging device, permanent batteries, replaceable batteries, and rechargeable batteries. The power supply 604 may also include an AC adapter; therefore, the processor-based system 600 may be plugged into a wall outlet, for example. The power supply 604 may also include a DC adapter such that the processor-based system 600 may be plugged into a vehicle cigarette lighter or a vehicle power port, for example.

Various other devices may be coupled to the processor 602 depending on the functions that the processor-based system 600 performs. For example, a user interface 606 may include input devices such as buttons, switches, a keyboard, a light pen, a mouse, a digitizer and stylus, a touch screen, a voice recognition system, a microphone, or a combination thereof. A display 608 may also be coupled to the processor 602. The display 608 may include an LCD display, an SED display, a CRT display, a DLP display, a plasma display, an OLED display, and LED display, a three-dimensional projection, an audio display, or a combination thereof. Furthermore, an RF sub-system/baseband processor 610 may also be coupled to the processor 602. The RF sub-system/baseband processor 610 may include an antenna that is coupled to an RF receiver and to an RF transmitter (not depicted). A communication port 612, or more than one communication port 612, may also be coupled to the processor 602. The communication port 612 may be adapted to be coupled to one or more peripheral devices 614, such as a modem, a printer, a computer, a scanner, or a camera, or to a network, such as a local area network, remote area network, intranet, or the Internet, for example.

The processor 602 may control the processor-based system 600 by implementing software programs stored in the memory. The software programs may include an operating system, database software, drafting software, word processing software, media editing software, or media playing software, for example. The memory is operably coupled to the processor 602 to store and facilitate execution of various programs. For example, the processor 602 may be coupled to system memory 616, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 616 may include volatile memory, non-volatile memory, or a combination thereof. The system memory 616 is typically large so that it can store dynamically loaded applications and data. In some embodiments, the system memory 616 may include semiconductor devices, such as the electronic devices (e.g., the electronic devices 100, 200, 300, 400) according to the embodiments of the disclosure, or a combination thereof.

The processor 602 may also be coupled to non-volatile memory 618. The non-volatile memory 618 may include one or more of STT-MRAM, MRAM, read-only memory (ROM) such as an EPROM, resistive read-only memory (RROM), and flash memory to be used in conjunction with the system memory 616. The size of the non-volatile memory 618 is typically selected to be just large enough to store any necessary operating system, application programs, and fixed data. Additionally, the non-volatile memory 618 may include a high-capacity memory such as a disk drive memory, such as a hybrid-drive including resistive memory or other types of non-volatile solid-state memory, for example. The non-volatile memory 618 may include electronic devices, such as the electronic devices (e.g., the electronic devices 100, 200, 300, 400) according to the embodiments of the disclosure, or a combination thereof.

Accordingly, a system includes a processor operably coupled to an input device and an output device and a memory device operably coupled to the processor, the memory device including at least one electronic device. The at least one electronic device includes strings of memory cells vertically extending through a stack of alternating dielectric materials and conductive materials, the conductive materials including an enlarged region proximal to the memory cells. One or more of the memory cells includes a high-k dielectric material laterally adjacent to the enlarged region of the conductive materials, a barrier oxide material laterally adjacent to the high-k dielectric material, a storage node material laterally adjacent to the barrier oxide material, a tunneling material laterally adjacent to the storage node material and the dielectric materials, and a channel material laterally adjacent to the tunneling material. A length of the high-k dielectric material is greater than a height of the enlarged regions of the conductive materials. A length of the storage node material is material is also greater than a height of the enlarged regions of the conductive materials.

The electronic devices and systems of the disclosure advantageously facilitate one or more of improved simplicity, greater packaging density, and increase miniaturization of components as compared to conventional structures, conventional devices, and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional microelectronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modification to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
   a stack structure comprising vertically alternating dielectric materials and conductive materials, the conductive materials comprising first regions and second regions;
   at least one pillar extending vertically continuously through the stack structure, the first regions of the conductive materials distal from the at least one pillar and the second regions of the conductive materials proximal to the at least one pillar, and the at least one pillar comprising a fill material, a channel material surrounding the fill material, and a tunneling material surrounding the channel material; and
   one or more segments of materials disposed between the at least one pillar and the second regions of the conductive materials, the one or more segments of materials convexly extending away from the second regions of the conductive materials, and the one or more segments of materials individually comprising a storage node material laterally adjacent to the at least one pillar, a high-k dielectric material laterally adjacent to the second regions of the conductive materials, and a barrier oxide material disposed laterally between the high-k dielectric material and the storage node material.

2. The electronic device of claim 1, wherein a height of the second regions of the conductive materials is greater than a height of the first regions of the conductive materials.

3. The electronic device of claim 1, wherein a length of the segments of the high-k dielectric material are greater than a height of the second regions of the conductive material.

4. The electronic device of claim 1, wherein a length of the storage node material in the one or more segments of materials is greater than a height of the second regions of the conductive materials.

5. The electronic device of claim 1, wherein the one or more segments of materials do not extend vertically over sidewalls of the dielectric materials.

6. The electronic device of claim 1, wherein portions of the channel material and the tunneling material laterally adjacent to the conductive materials are closer to a central portion of the at least one pillar than additional portions of the channel material and the tunneling material laterally adjacent to the dielectric materials.

7. The electronic device of claim 1, wherein the second regions of the conductive materials exhibit one of a round, elliptical, or polygonal shape extending toward the center portion of the pillar from the first region of the conductive materials.

8. A method of forming an electronic device, the method comprising:
   forming pillar openings in a stack structure comprising vertically alternating nitride materials and dielectric materials;
   selectively forming a sacrificial material exhibiting a curved profile on ends of the nitride materials adjacent to the pillar openings;
   forming cell films adjacent to the sacrificial material and the dielectric materials, the cell films comprising a high-k dielectric material, a barrier oxide material, a storage node material, a tunneling material, and a channel material;
   removing the nitride materials and the sacrificial material to form first openings in the stack structure, the first openings having an enlarged portion proximal the cell films;
   forming a conductive material in the first openings, the conductive material comprising a tier region distal to the cell films and an enlarged region proximal to the cell films, sidewall of the enlarged region of the conductive material exhibiting the curved profile;
   removing the dielectric materials to form second openings in the stack structure vertically adjacent to the conductive material;

selectively removing exposed portions of the high-k dielectric material, the barrier oxide material, and the storage node material proximal to the second openings to form segments of materials comprising the high-k dielectric material laterally adjacent to the enlarged region of the conductive material, a barrier oxide material laterally adjacent to the high-k dielectric material, and a storage node material laterally adjacent to the barrier oxide material, wherein the segments of materials exhibit an additional curved profile parallel to the curved profile of the enlarged region of the conductive material; and forming an oxide material in the second openings to at least partially fill the second openings.

9. The method of claim 8, wherein selectively forming a sacrificial material comprises forming the sacrificial material to have a height greater than a height of the nitride materials.

10. The method of claim 9, wherein forming a conductive material in the first openings comprises forming the enlarged region of the conductive material exhibiting a greater height than a height of the tier region.

11. The method of claim 8, wherein the nitride materials and the sacrificial material comprise different material compositions.

12. The method of claim 8, wherein forming an oxide material in the second openings to at least partially fill the second openings comprises forming an air gap in the oxide material.

13. The method of claim 8, wherein selectively forming a sacrificial material on ends of the nitride materials comprises forming the sacrificial material to extend farther toward a central region of the pillar opening relative to the dielectric materials, the sacrificial material exhibiting a substantially non-planar topography extending vertically along the pillar openings.

14. The method of claim 8, wherein forming cell films adjacent to the sacrificial material and the dielectric materials comprises conformally forming the cell films adjacent to the sacrificial material and the dielectric materials.

15. The method of claim 8, wherein selectively removing exposed portions of the high-k dielectric material, the barrier oxide material, and the storage node material comprises forming the segments of materials, the high-k dielectric material of the segments of the materials exhibiting a length greater than a height of the tier region of the conductive material.

16. A system, comprising:
a processor operably coupled to an input device and an output device; and
a memory device operably coupled to the processor and comprising at least one electronic device, the at least one electronic device comprising:
strings of memory cells vertically extending through a stack of alternating dielectric materials and conductive materials, the conductive materials comprising tier regions and enlarged regions, and sidewalls of the enlarged regions of the conductive materials exhibiting a curved profile;
at least one pillar extending vertically and continuously through the stack, the at least one pillar relatively more proximal to the enlarged regions of the conductive materials and relatively more distal from the tier regions of the conductive materials, and the at least one pillar comprising a fill material, a channel material surrounding the fill material, and a tunneling material surrounding the channel material; and
one or more segments of materials disposed between the at least one pillar and the enlarged regions of the conductive materials, the one or more segments of materials exhibiting an additional curved profile parallel to the curved profile of the sidewalls of the enlarged regions of the conductive materials, and
the one or more segments of materials individually comprising a high-k dielectric material laterally adjacent to the enlarged region of the conductive materials, a barrier oxide material laterally adjacent to the high-k dielectric material, and a storage node material laterally adjacent to the barrier oxide material.

17. The system of claim 16, wherein sidewalls of the enlarged region of the conductive materials are not vertically aligned with sidewalls of the dielectric materials.

18. The system of claim 16, wherein the enlarged regions of the conductive materials have a height greater than a height of the tier regions of the conductive materials.

* * * * *

UNITED STATES PATENT AND TRADEMARK OFFICE
CERTIFICATE OF CORRECTION

PATENT NO. : 12,477,730 B2  
APPLICATION NO. : 17/804752  
DATED : November 18, 2025  
INVENTOR(S) : Yifen Liu et al.

It is certified that error appears in the above-identified patent and that said Letters Patent is hereby corrected as shown below:

In the Specification

| | | |
|---|---|---|
| Column 6, | Line 7, | change "silicon-on-insulator ("SOT") substrates," to --silicon-on-insulator ("SOI") substrates,-- |
| Column 10, | Lines 40-41, | change "(e.g. titanium," to --(e.g., titanium,-- |
| Column 14, | Line 66, | change "length Luo that" to --length $L_{120}$ that-- |
| Column 15, | Line 6, | change "length Luo may" to --length $L_{120}$ may-- |
| Column 15, | Line 20, | change "length Luo of" to --length $L_{120}$ of-- |
| Column 15, | Line 56, | change "FIG. 2 as 4124. The" to --FIG. 2 as $\Delta_{124}$. The-- |
| Column 16, | Line 37, | change "length $L_{12}^0$ that is" to --length $L_{120}$ that is-- |

Signed and Sealed this  
Thirteenth Day of January, 2026

John A. Squires  
*Director of the United States Patent and Trademark Office*